United States Patent
Forbes et al.

(10) Patent No.: US 7,141,824 B2
(45) Date of Patent: Nov. 28, 2006

(54) TRANSISTOR WITH VARIABLE ELECTRON AFFINITY GATE

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/073,773

(22) Filed: Mar. 7, 2005

(65) Prior Publication Data

US 2005/0146934 A1    Jul. 7, 2005

Related U.S. Application Data

(60) Division of application No. 09/691,004, filed on Oct. 18, 2000, now Pat. No. 6,965,123, which is a continuation of application No. 08/903,452, filed on Jul. 29, 1997, now abandoned.

(51) Int. Cl.
*H01L 29/15* (2006.01)
*H01L 31/0312* (2006.01)

(52) U.S. Cl. .................. 257/77; 257/315; 257/316; 257/E29.129; 257/E29.3

(58) Field of Classification Search .................. 257/77, 257/76, 314, 315, 316, 407, E29.129, E29.3; 365/185.01, 185.12
See application file for complete search history.

(56) References Cited

U.S. PATENT DOCUMENTS

| | | | |
|---|---|---|---|
| 3,792,465 A | 2/1974 | Collins et al. | |
| 4,113,515 A | 9/1978 | Kooi et al. | |
| 4,118,795 A | 10/1978 | Frye et al. | |
| 4,384,349 A | 5/1983 | McElroy | |
| 4,460,670 A | 7/1984 | Ogawa et al. | |
| 4,462,150 A | 7/1984 | Nishimura et al. | |
| 4,473,836 A | 9/1984 | Chamberlain | |
| 4,507,673 A * | 3/1985 | Aoyama et al. | ............ 257/324 |
| 4,598,305 A | 7/1986 | Chiang et al. | |
| 4,657,699 A | 4/1987 | Nair | |
| 4,736,317 A | 4/1988 | Hu et al. | |
| 4,738,729 A | 4/1988 | Yoshida et al. | |
| 4,768,072 A | 8/1988 | Seki et al. | |
| 4,769,686 A | 9/1988 | Horiuchi et al. | |
| 4,816,883 A | 3/1989 | Baldi | |
| 4,841,349 A | 6/1989 | Nakano | |
| 4,849,797 A | 7/1989 | Ukai et al. | |
| 4,852,062 A | 7/1989 | Baker et al. | |
| 4,893,273 A | 1/1990 | Usami | |

(Continued)

FOREIGN PATENT DOCUMENTS

EP    0291951    8/1993

(Continued)

OTHER PUBLICATIONS

Freitas, Robert A., "Nanomedicine, vol. 1: Basic Capabilities, Appendix A", *Landes Bioscience*, Georgetown, TX, http://www.nanomedicine.com/NMI/AppendixA.htm,(1999),23 pages.

(Continued)

*Primary Examiner*—Evan Pert
*Assistant Examiner*—Victor A. Mandala, Jr.
(74) *Attorney, Agent, or Firm*—Schwegman, Lundberg, Woessner & Kluth, P.A.

(57) ABSTRACT

A SiC material composition is selected to establish the barrier energy between the SIC gate and a gate insulator. Various embodiments of selected SiC material composition include a memory application, such as a flash EEPROM, and a light detector or imaging application.

29 Claims, 11 Drawing Sheets

U.S. PATENT DOCUMENTS

| | | |
|---|---|---|
| 4,897,710 A | 1/1990 | Suzuki et al. |
| 4,929,985 A | 5/1990 | Takasaki |
| 4,980,303 A | 12/1990 | Yamauchi |
| 4,994,401 A | 2/1991 | Ukai |
| 5,032,883 A | 7/1991 | Wakai et al. |
| 5,049,950 A | 9/1991 | Fujii et al. |
| 5,111,430 A | 5/1992 | Morie |
| 5,145,741 A | 9/1992 | Quick |
| 5,189,504 A | 2/1993 | Nakayama et al. |
| 5,235,195 A | 8/1993 | Tran et al. |
| 5,260,593 A | 11/1993 | Lee |
| 5,293,560 A | 3/1994 | Harari |
| 5,298,796 A | 3/1994 | Tawel |
| 5,317,535 A | 5/1994 | Talreja et al. |
| 5,336,361 A | 8/1994 | Tamura et al. |
| 5,360,491 A | 11/1994 | Carey et al. |
| 5,366,713 A | 11/1994 | Sichanugrist et al. |
| 5,367,306 A | 11/1994 | Hollon et al. |
| 5,369,040 A | 11/1994 | Halvis et al. |
| 5,371,383 A | 12/1994 | Miyata et al. |
| 5,388,069 A | 2/1995 | Kokubo |
| 5,393,999 A | 2/1995 | Malhi |
| 5,407,845 A | 4/1995 | Nasu et al. |
| 5,409,501 A | 4/1995 | Zauns-Huber et al. |
| 5,415,126 A | 5/1995 | Loboda et al. |
| 5,424,993 A | 6/1995 | Lee et al. |
| 5,425,860 A | 6/1995 | Truher et al. |
| 5,438,544 A | 8/1995 | Makino |
| 5,441,901 A | 8/1995 | Candelaria |
| 5,449,941 A | 9/1995 | Yamazaki et al. |
| 5,455,432 A | 10/1995 | Hartsell et al. |
| 5,465,249 A | 11/1995 | Cooper, Jr. et al. |
| 5,467,306 A | 11/1995 | Kaya et al. |
| 5,477,485 A | 12/1995 | Bergemont et al. |
| 5,493,140 A | 2/1996 | Iguchi |
| 5,508,543 A | 4/1996 | Hartstein et al. |
| 5,530,581 A | 6/1996 | Cogan |
| 5,557,114 A | 9/1996 | Leas et al. |
| 5,557,122 A | 9/1996 | Shrivastava et al. |
| 5,562,769 A | 10/1996 | Dreifus et al. |
| 5,580,380 A | 12/1996 | Liu et al. |
| 5,604,357 A | 2/1997 | Hori |
| 5,604,700 A | 2/1997 | Parris et al. |
| 5,614,748 A | 3/1997 | Nakajima et al. |
| 5,623,160 A | 4/1997 | Liberkowski |
| 5,623,442 A | 4/1997 | Gotou et al. |
| 5,629,222 A | 5/1997 | Yamazaki et al. |
| 5,654,208 A | 8/1997 | Harris et al. |
| 5,661,312 A | 8/1997 | Weitzel et al. |
| 5,670,790 A | 9/1997 | Katoh et al. |
| 5,672,889 A | 9/1997 | Brown |
| 5,698,869 A | 12/1997 | Yoshimi et al. |
| 5,698,879 A | 12/1997 | Aritome et al. |
| 5,714,766 A | 2/1998 | Chen et al. |
| 5,719,410 A | 2/1998 | Suehiro et al. |
| 5,734,181 A | 3/1998 | Ohba et al. |
| 5,738,731 A | 4/1998 | Shindo et al. |
| 5,740,104 A | 4/1998 | Forbes |
| 5,754,477 A | 5/1998 | Forbes |
| 5,774,400 A | 6/1998 | Lancaster et al. |
| 5,786,250 A | 7/1998 | Wu et al. |
| 5,789,276 A | 8/1998 | Leas et al. |
| 5,798,548 A * | 8/1998 | Fujiwara .................... 257/319 |
| 5,801,401 A | 9/1998 | Forbes |
| 5,808,336 A | 9/1998 | Miyawaki |
| 5,828,101 A | 10/1998 | Endo |
| 5,846,859 A | 12/1998 | Lee |
| 5,858,811 A | 1/1999 | Tohyama |
| 5,861,346 A | 1/1999 | Hamza et al. |
| 5,877,041 A | 3/1999 | Fuller |
| 5,886,368 A | 3/1999 | Forbes et al. |
| 5,886,376 A | 3/1999 | Acovic et al. |
| 5,886,379 A | 3/1999 | Jeong |
| 5,898,197 A | 4/1999 | Fujiwara |
| 5,907,775 A | 5/1999 | Tseng |
| 5,910,665 A | 6/1999 | Plumton et al. |
| 5,912,837 A | 6/1999 | Lakhani |
| 5,926,740 A | 7/1999 | Forbes et al. |
| 5,976,926 A | 11/1999 | Wu et al. |
| 5,989,958 A | 11/1999 | Forbes |
| 5,990,531 A | 11/1999 | Taskar et al. |
| 6,018,166 A | 1/2000 | Lin et al. |
| 6,031,263 A | 2/2000 | Forbes et al. |
| 6,034,001 A | 3/2000 | Shor et al. |
| 6,049,091 A | 4/2000 | Yokoyama |
| 6,075,259 A | 6/2000 | Baliga |
| 6,084,248 A | 7/2000 | Inoue |
| 6,093,937 A | 7/2000 | Yamazaki et al. |
| 6,099,574 A | 8/2000 | Fukuda et al. |
| 6,100,193 A | 8/2000 | Suehiro et al. |
| 6,130,147 A | 10/2000 | Major et al. |
| 6,144,581 A | 11/2000 | Diorio et al. |
| 6,163,066 A | 12/2000 | Forbes et al. |
| 6,166,401 A | 12/2000 | Forbes |
| 6,166,768 A | 12/2000 | Fossum et al. |
| 6,177,706 B1 | 1/2001 | Shindo et al. |
| 6,249,020 B1 | 6/2001 | Forbes et al. |
| 6,271,566 B1 | 8/2001 | Tsuchiaki |
| 6,297,521 B1 | 10/2001 | Forbes et al. |
| 6,307,775 B1 | 10/2001 | Forbes et al. |
| 6,309,907 B1 | 10/2001 | Forbes et al. |
| 6,365,919 B1 | 4/2002 | Tihanyi et al. |
| 6,835,638 B1 | 12/2004 | Forbes et al. |
| 6,936,849 B1 | 8/2005 | Forbes et al. |
| 7,005,344 B1 | 2/2006 | Forbes et al. |
| 2006/0017095 A1 | 1/2006 | Forbes et al. |
| 2006/0024878 A1 | 2/2006 | Forbes et al. |

FOREIGN PATENT DOCUMENTS

| | | |
|---|---|---|
| EP | 0681333 | 11/1995 |
| JP | 57-126175 | 8/1982 |
| JP | 60-024678 | 2/1985 |
| JP | 60-184681 | 9/1985 |
| JP | 60-242678 | 12/1985 |
| JP | 62-086867 | 4/1987 |
| JP | 62-122275 | 6/1987 |
| JP | 63-128760 | 6/1988 |
| JP | 63-181473 | 7/1988 |
| JP | 63-219172 | 9/1988 |
| JP | 63-289960 | 11/1988 |
| JP | 01-115162 | 5/1989 |
| JP | 02-203564 | 8/1990 |
| JP | 03-222367 | 10/1991 |
| JP | 04-056769 | 2/1992 |
| JP | 06-013626 | 1/1994 |
| JP | 06-224431 | 8/1994 |
| JP | 06-302828 | 10/1994 |
| JP | 07-115191 | 5/1995 |
| JP | 07-226507 | 8/1995 |
| JP | 7326718 | 12/1995 |
| JP | 08-255878 | 10/1996 |
| JP | 08-255878-TR | 10/1996 |

OTHER PUBLICATIONS

Michaelson, Herbert B., "The work function of the elements and its periodicity", *Journal of Applied Physics*, 48(11), (Nov. 1977),4729-4733.

Pierret, Robert F., "Field Effect Devices", *Modular Series on Solid State Devices*, vol. IV, Addison-Wesley Publishing Company, Reading, MA,(1983),23, 63.

Akasaki, I. , "Effects of AlN Buffer Layer on Crystallographic Structure and on Electrical and Optical Properties of GaN and Ga(1-x)Al(x)N [0<x(<or =)0.4] Films Grown on Sapphire Substrate by MOVPE", *Journal of Crystal Growth*, 98, (1989),209-219.

Alok, D., et al., "Electrical Properties of Thermal Oxide Grown on N-type 6H-Silicon Carbide", *Applied Physcis Letters*, 64, (May 23, 1994),2845-2846.

Andrieux, M., et al., "Interface and Adhesion of PACVD SiC Based Films on Metals", *Supp. Le Vide: science, technique et applications*, 279, (1996),212-214.

Bachmann, P., et al., "Influence on Surface Modifications on the Electronic Properties of CVD Diamond Films", *Diamond and Related Materials*, 5, (1996), 1378-1383.

Baglee, D., "Characteristics & Reliability of 100 Angstrom Oxides", *IEEE 22nd Annual Proc.: Reliability Physics*, Las Vegas,(Apr. 3-5, 1984), 152-155.

Beheim, G., et al., "Magnetron Plasma Etching of SiC for Microstructures", *Proc: SPIE—Integrated Optics and Microstructures III*, San Jose, CA,(Jan. 29, 1996),82-86.

Beltram, F., et al., "GaAlAs/GaAs Floating-Gate Memory Devices with Graded-Gap Injector Grown by Molecular-Beam Epitaxy", *IEEE Transactions on Electron Devices*, 35(10), Abstract No. VA-7,(Dec. 1988),2451.

Beltram, F., et al., "Memory phenomena in heterojunction structures: Evidence for suppressed thermionic emission", *Appl. Phys. Lett.*, 53(5), (1988),376-378.

Bengtsson, S., et al., "Applications of Aluminum Nitride Films Deposited by Reactive Sputtering to Silicon-On-Insulator Materials", *Japanese J. Applied Physics*, 35, (1996),4175-4181.

Benjamin, M., "UV Photoemission Study of Heteroepitaxial AlGaN Films Grown on 6H-SiC", *Applied Surface Science*, 104/105, (Sep. 1996),455-460.

Bermudez, V., "The Growth and Properties of Al and AlN Films on GaN(0001)-(1×1)", *Journal of Applied Physics*, 79(1), (Jan. 1996),110-119.

Boeringer, Daniel W., et al., "Avalanche amplificaiton of multiple resonant tunneling through parallel silicon microcrystallites", *Physical Rev. B*, 51, (1995), 13337-13343.

Burns, S. G., et al., "In: Principles of Electronic Circuits", *West Publishing Company*, St. Paul, MN, (1987),382-383.

Burns, S. G., et al., "In: Principles of Electronic Circuits", *West Publishing Co.*, St. Paul, MN, (1987),382-383.

Burns, S., et al., "In: Principles of Electronic Circuits", *West Publishing Company*, (1987),380.

Capasso, F., et al., "New Floating-Gate AlGaAs/GaAs Memory Devices with Graded-Gap Electron Injector and Long Retention Times", *IEEE Electron Device Letters*, (1988),377-379.

Casey, H., et al., "Low Interface Trap Density for Remote Plasma Deposited SiO2 on n-type GaN", *Applied Phys. Lett.*, 68, (Mar. 1996), 1850-1852.

Chang, C., "Novel Passivation Dielectrics—The Boron- or Phosphorus-Doped Hydrogenated Amorphous Silicon Carbide Films", *Journal of the Electrochemical Society*, 132, (Feb. 1985),418-422.

Choi, J., et al., "Effect of Deposition Conditions and Pretreatments on the Microstructure of MPECVD Diamond Thin Films", *Materials Chemistry and Physics*, 45, (1996),176-179.

Clarke, G., et al., "The Infrared Properties of Magnetron-Sputtered Diamond-Like Thin Films", *Thin Solid Films*, 280, (1996), 130-135.

Compagnini, G., et al., "Spectroscopic Characterization of Annealed Si(1-x)C(x) Films", *J. Materials Res.*, 11, (Sep. 1996),2269-2273.

Dartnell, N., et al., "Reactive Ion Etching of Silicon Carbide (Si(x)C(1-x))", *Vacuum*, 46, (1995),349-355.

Demichelis, F., "Influence of Doping on the Structural and Optoelectronic Properties of Amorphous and Microcrystalline Silicon Carbide", *Journal of Applied Physics*, 72(4), (Aug. 15, 1992), 1327-1333.

Demichelis, F., "Physical Properties of Undoped and Doped Microcrystalline SiC:H Deposited By PECVD", *Materials Research Society Symposium Proceedings*, 219, Anaheim, CA,(Apr. 30-May 3, 1991), 413-418.

Dipert, Brian, "Flash Memory Goes Mainstream", *IEEE Spectrum*, 30(10), Oct. 1993),48-52.

Edelberg, E., et al., "Visible Luminescence from Nanocrystalline silicon films produced by plasma enhanced chemical vapor deposition", *Appl. Phys. Lett.*, 68, (1996), 1415-1417.

Fissel, A., et al., "Epitaxial Growth of SiC Thin Films on Si-stabilized alpha-SiC (0001) at Low Temperatures by Solid-source Molecular Beam Epitaxy", *Journal of Crystal Growth*, 154, (1995),72-80.

Friedrichs, P., et al., "Interface Properties of Metal-Oxide-Semiconductor Structures on N-Type 6H and 4H-SiC", *Journal of Applied Physics*, 79(10), (May 15, 1996),7814-7819.

Fujii, T., et al., "Bonding Structures in Highly Photoconductive a-SiC:H Films Deposited by Hybrid-Plasma Chemical Vapor Deposition", *Journal of Non-Crystalline Solids*, 198-200, (1996),577-581.

Goetzberger, A., et al., *Applied Solid State Science: Advances in Materials and Device Research*, R. Wolfe, ed., Academic Press, New York,(1969),Including p. 233.

Graul, J., et al., "Growth Mechanism of Polycrystalline beta-SiC Layers on Silicon Substrate", *Applied Phys. Lett.*, 21, (Jul. 1972),67-69.

Hamakawa, Y., et al., "Optoelectronics and Photovoltaic Applications of Microcrystalline SiC", *Materials Research Society Symposium Proceedings*, 164, Boston, MA,(Nov. 29-Dec. 1, 1989),291-301.

He, Z., et al., "Ion-beam-assisted Deposition of Si-carbide Films", *Thin Solid Films*, 260, (1995),32-37.

Hu, G., "Will Flash Memory Replace Hard Disk Drive?", *1994 IEEE International Electron Device Meeting*, Panel Discussion, Session 24, Outline,(Dec. 1994),2 pages.

Hwang, J., et al., "High Mobility beta-SiC Epilayer Prepared by Low-pressure Rapid Thermal Chemical Vapor Deposition on a (100) Silicon Substrate", *Thin Solid Films*, 272, (1996),4-6.

Hybertsen, Mark S., "Absorption and Emission of Light in Nanoscale Silicon Structures", *Phys. Rev. Lett.*, 72, (1994),1514-1517.

Jou, S., et al., "Electron Emission Characterization of Diamond Thin Films Grown from a Solid Carbon Source", *Thin Solid Films*, 280, (1996),256-261.

Kato, Masataka, et al., "Read-Disturb Degradation Mechanism due to Electron Trapping in the Tunnel Oxide for Low-voltage Flash Memories", *IEEE Electron Device Meeting*, (1994),45-48.

Kothandaraman, M., et al., "Reactive Ion Etching of Trenches in 6H-SiC", *J. Electronic Materials*, 25, (1996),875-878.

Kumbhar, A., et al., "Growth of Clean Amorphous Silicon-Carbon Alloy Films by Hot-Filament Assisted Chemical Vapor Deposition Technique", *Applied Phys. Lett*, 66, (Apr. 1995), 1741-1743.

Lakshmi, E., et al., "Interface-State Characteristics of GaN/GaAs MIS Capacitors", *Solid-State Electronics*, 25, (1982),811-815.

Lanois, F., et al., "Angle Etch Control for Silicon Carbide Power Devices", *Applied Phys. Lett.*, 69, (Jul. 1996),236-238.

Lau, S., et al., "Optoelectronic Properties of Highly Conductive Microcrystalline SiC Produced by Laser Crystallization of Amorphous SiC", *J. of Non-Crystalline Solids*, 198-200, (1996),907-910.

Leggieri, G., et al., "Laser Ablation Deposition of Silicon Carbide Films", *Applied Surface Science*, 96-98, (1996),866-869.

Lei, T., "Epitaxial Growth and Characterization of Zinc-Blende Gallium Nitride on (001) Silicon", *Journal of Applied Physics*, 71(10), (May 1992),4933-4943.

Lin, B., et al., "Dramatic Reduction of Sidegating in MODFET's", *IEEE Transactions on Electron Devices*, 35, Abstract No. VA-6,(1988),p. 2451.

Liu, J., et al., "Formation of SiC Films on Silicon Field Emitters", *Materials Res. Soc. Symp. Proc.*, 311, San Francisco, CA,(Apr. 13-15, 1993).

Liu, J., et al., "Modification of Si Field Emitter Surfaces by Chemical Conversion to SiC", *J. Vac. Sci. Technology*, B 12, (1994),717-721.

Lott, J., et al., "Anisotropic thermionic emission of electrons contained in GaAs/AlAs floating gate device structures", *Appl. Phys. Lett.*, 55(12), (1989),pp. 1226-1228.

Lott, J. A., et al., "Charge Storage in InAlAs/InGaAs/InP Floating Gate Heterostructures", *Electronics Letters*, 26, (Jul. 5, 1990),972-973.

Luo, J., et al., "Localized Epitaxial Growth of Hexagonal and Cubic SiC Films on Si by Vacuum Annealing", *Applied Phys. Lett.*, 69, (Aug. 1996),916-918.

Madelung, O., "Semiconductors—Basic Data", *Springer-Verlag, Second Revised Edition*, ISBN: 3-540-53150-5,(1996),49-53.

Martins, R., "Transport Properties of Doped Silicon Oxycarbide Microcrystalline Films Produced by Spatial Separation Techniques", *Solar Energy Materials and Solar Cells*, 41-42, (1996),493-517.

Martins, R., "Wide Band Gap Microcrystalline Silicon Thin Films", *Diffusion and Defect Data : Solid State Phenomena*, 44-46, Part 1, Scitec Publications,(1995),299-346.

Maury, F., et al., "Chemical Vapor Co-Deposition of C and SiC at Moderate Temperature for the Synthesis of Compositionally Modulated Si(x)C(1-x) Ceramic Layers", *Surface and Coatings Technology*, 76-77, (1995),119-125.

McLane, G., et al., "High Etch Rates of SiC in Magnetron Enhanced SF(6) Plasmas", *Applied Phys. Lett.*, 68, (Jun. 1996),3755-3757.

Mogab, C., et al., "Conversion of Si to Epitaxial SiC by Reaction with C(2)H(2)", *Journal of Applied Physics*, 45, (Mar. 1974), 1075-1084.

Mohammad, S. N., et al., "Emerging Gallium Nitride Based Devices", *Proceedings of the IEEE*, 83, (Oct. 1995), 1306-1355.

Molnar, R., "Growth of Gallium Nitride by Electron-Cyclotron Resonance Plasma-Assisted Molecular-Beam Epitaxy: The Role of Charged Species", *Journal of Applied Physics*, 76(8), (Oct. 1994),4587-4595.

Molotskii, M, "Auger mechanism of exoelectron emission in dielectrics with high electron affinity", *Journal of Applied Physics*, vol. 94, No. 7, (Oct. 1, 2003),4652-4658.

Muller, K., et al., "Trench Storage Node Technology for Gigabit DRAM Generations", *Digest IEEE International Electron Devices Meeting*, San Francisco, CA,(Dec. 1996),507-510.

Nakamura, J., et al., "CMOS Active Pixel Image Sensor with Simple Floating Gate Pixels", *IEEE Transactions on Electron Devices*, 42, (1995),1693-1694.

Nemanich, P, et al., "Diamond Negative Electron Affinity Surfaces, Structures and Devices", *Proc. : Third International Conference on Applications of Diamond Films and Related Materials*, 1, Gaithersburg, MD,(1995),17-24.

Nemanich, R., et al., "Negative Electron Affinity Surfaces of Aluminum Nitride and Diamond", *Diamond and Related Materials*, 5, (1996),790-796.

Neudeck, P., et al., "Electrical Characterization of a JFET-Accessed GaAs Dynamic RAM Cell", *IEEE Electron Device Letters*, 10(11), (1989), pp. 477-480.

Ng, K., *In: Complete Guide To Semiconductor Devices*, McGraw-Hill, Inc. New York,(1995),pp. 322-328, 605-608.

Ouyang, M., et al., "Deposition of Diamond-Like Carbon Films via Excimer Laser Ablation of Polybutadiene", *Materials Science and Engineering*, B39, (1996),228-231.

Pankove, J., "Photoelectric Emission", *In: Optical Processes in Semiconductors*, Dover Publications Inc., New York,(1971),287-301.

Pankove, J., "Photoemission from GaN", *Applied Physics Letters*, 25(1), (Jul. 1, 1974),53-55.

Papadas, C., "Modeling of the Intrinsic Retention Characteristics of FLOTOX EEPROM Cells Under Elevated Temperature Conditions", *IEEE Transaction on Electron Devices*, 42, (Apr. 1995),678-682.

Patuwathavithane, C., et al., "Oxidation Studies for 6H-SiC", *Proc: 4th Int. Conf. on Amorphous and Crystalline Silicon Carbide IV*, Santa Clara, CA,(Oct. 9-11, 1991),163-169.

Pereyra, I., et al., "Wide Gap a-Si(1-x)C(x): H Thin Films Obtained Under Starving Plasma Deposition Conditions", *J. Non-Crystalline Solids*, 201, (1996),110-118.

Pollack, S., "Electron Transport Through Insulating Thin Films", *Appl. Solid-State Science*, 1, (1969),345-355.

Prendergast, Jim, "FLASH or DRAM: Memory Choice for the Future", *IEEE Electron Device Meeting, Session 25*, Phoenix, AZ,(1995).

Qian, Q., et al., "Multi-Day Dynamic Storage of Holes at the AlAs/GaAs Interface", *IEEE Electron Device Letters, EDL-7*(11), (1986),pp. 607-609.

Rahman, M., et al., "Preparation and Electrical Properties of An Amorphous SiC/ Crystalline Si p(+)n Heterostructure", *Japanese Journal of Applied Physics*, 23, (May 1984),515-524.

Renlund, G, et al., "Silicon Oxycarbide Glasses: Part I. Preparation and Chemistry", *Journal of Materials Research*, 6, (Dec. 1991),2716-2722.

Renlund, G., "Silicon Oxycarbide Glasses: Part II. Structure and Properties", *Journal of Materials Research*, 6, (Dec. 1991),2723-2734.

Ruska, W. S., "Microelectronic Processing", *McGraw-Hill Book Co.*, (1987),281.

Sakata, I., et al., "Amorphous Silicon/Amorphous Silicon Carbide Heterojunctions Applied to Memory Device Structures", *Electronics Letters*, 30(9), (1994),688-689.

Schmidt, I., et al., "Low Temperature Diamond Growth Using Fluorinated Hydrocarbons", *Diamond and Related Materials*, 5, (1996), 1318-1322.

Schoenfeld, O., et al., "Formation of Si Quantum dots in Nanocrystalline silicon", *Proc. 7th Int. Conf. on Modulated Semiconductor Structures*, Madrid, (1995),605-608.

Serre, C., et al., "Ion-Beam Synthesis of Amorphous SiC Films: Structural Analysis and Recrystallization", *J. Appl. Phys.*, 79, (May 1996),6907-6913.

Sharma, B., et al., "Heterojunction Devices", *In: Semiconductor Heterojunctions*, Pergamon Press, New York,(1974),pp. 133-137.

Sim, S., et al., "A New Planar Stacked Technology (PST) for Scaled and Embedded DRAMs", *Digest IEEE Int. Electron Devices Meeting*, San Francisco, CA,(Dec. 1996),504-507.

Streetman, B., *In: Solid State Electronic Devices, 4th Edition*, Prentice Hall, New Jersey,(1995),pp. 217-219, 392-394.

Suzaki, Y, et al., "Quantum Size Effects of a-Si(:H)/a-SiC(:H) Multilayer Films Prepared by rf Sputtering", *Abstracts of Papers Published in the Int. J. Japenese Soc. for Precision Engineering*, 28, Abstract of Paper in vol. 60,(Jun. 1994), 182.

Svirkova, N., et al., "Deposition Conditions and Density-of-States Spectrum of a-Si(1-x)C(x) :H Films Obtained by Sputtering", *Semiconductors*, 28, (Dec. 1994), 1164-1169.

Sze, S., *Physics of Semiconductors*, 2nd Edition., John Wiley & Sons, Pub., New York, ISBN 0471056618,(1981).

Sze, S. M., *In: Physics of Semiconductor Devices*, Wiley-Interscience, New York,(1969),p. 496-497.

Sze, S. M., *In: Physics of Semiconductor Devices. 2nd Edition*, John Wiley & Sons, New York,(1981),pp. 122-129,700-703, 708-710,763-765.

Sze, S. M., *In: Physics of Semiconductor Devices, Second Edition*, John Wiley & Sons, Inc., New York,(1981),p. 848.

Tarui, Y., "Flash Memory Features Simple Structure, Superior Integration", *JEE*, 30, (Sep. 1993),84-87.

Tenhover, M., et al., "DC-Magnetron Sputtered Silicon Carbide", *Materials Res. Soc. Symp. Proc.*, 356, Boston, MA,(Nov. 28-Dec. 2, 1994),227-232.

Thomas, J., et al., "Plasma Etching and Surface Analysis of a-SiC :H Films Deposited by Low Temperature Plasma Enhanced Chemical Vapor Deposition", *Materials Res. Soc. Symp. Proc.*, 334, Boston, MA,(Nov. 29-Dec. 2, 1993),445-450.

Tiwari, S., et al., "A silicon nanocrystal based memory", *Appl. Physics Lett.*, 68, (1996), 1377-1379.

Tiwari, Sandip, "Volatile and Non-Volatile Memories in Silicon with Nano-Crystal Storage", *Int'l Electron Devices Meeting: Technical Digest*, Washington, DC,(Dec. 1995),521-524.

Tsu, Raphael, et al., "Slow Conductance oscillations in nanoscale silicon clusters of quantum dots", *Appl. Phys. Lett.*, 65, (1994),842-844.

Tsu, R., et al., "Tunneling in Nanoscale Silicon Particles Embedded in an a-SiO2 Matrix", *Abstract, IEEE Device Research Conference*, (1996),pp. 178-179.

Tucker, C., et al., "Ion-beam-assisted Deposition of Nonhydrogenated a-Si:C Films", *Can. J. Physics*, 74, (1996),97-101.

Van Der Weide, J., et al., "Negative-electron-affinity Effects on the Diamond (100) Surface", *Physical Review B [Condensed Matter]*, 50, (Aug. 15, 1994),5803-5806.

Vodakov, Y., et al., "Diffusion and Solubility of Impurities in Silicon Carbide", *In: Silicon Carbide*, R.C. Marshall, et al., eds., Univ. of South Carolina Press,(1973),508-519.

Wahab, Q., et al., "3C-SiC / Si / 3C-SiC Epitaxial Trilayer Films Deposited on Si (111) Substrates by Reactive Magnetron Sputtering", *J. Materials Res.*, 10, (Jun. 1995), 1349-1351.

Watanabe, A., et al., "SiC Thin Film Preparation by ArF Excimer Laser Chemical Vapor Deposition. Part 1: Rate of Photolysis of Alkylsilanes by ArF Excimer Laser and their Decomposition Products", *Thin Solid Films*, 274, (1996),70-75.

Wolf, S., *Silicon Processing for the VLSI Era*, vol. 3, Lattice Press, Sunset Beach, CA,(1995),311-312.

Wolf, S., "Semiconductor Memory Process Integration", *Silicon Processing for The VLSI Era*, vol. 2: Process Integration, (1990),pp. 623-628.

Wolf, "Semiconductor Memory Process Integration", *Silicon Processing for the VLSI Era vol. 2: Process Integration*, Lattice Press, California,(1990),623-626.

Wolter, S., et al., "Textured Growth of Diamond on Silicon via in situ Carburization and Bias-Enhanced Nucleation", *Appl. Phys. Lett.*, 62, (Mar. 1993), 1215-1217.

Wu, K., et al., "The Growth and Characterization of Silicon/Silicon Carbide Heteroepitaxial Films on Silicon Substrates by Rapid Thermal Chemical Vapor Deposition", *Japanese J. Appl. Phys.*, 35, (1996),3836-3840.

Yamaguchi, Y., et al., "Properties of Heteroepitaxial 3C-SiC Films Grown by LPCVD", *Digest of Tech. Papers: 8th Int. Conf. on Solid-State Sensors and Actuators and Eurosensors IX*, vol. 2, Stockholm, Sweden,(Jun. 1995),190-193.

Yamanashi, H., et al., "Deposition of Silicon Compound Thin Films in DC Discharge Plasma Using Hydrogen-Hexamethyldisilane Gas Mixture", *Proc.: Int. Symp. on Surfaces and Thin Films of Electronic Materials. Bull. of the Res. Institute of Electronics, Shizuoka University*, 30, (1995),95-98.

Ye, Qiu-Yi, et al., "Resonant Tunneling via Microcrystalline-silicon quantum confinement", *Physical Rev. B*, 44, (1991), 1806-1811.

Yee, A., et al., "The Effect of Nitrogen on Pulsed Laser Deposition of Amorphous Silicon Carbide Films: Properties and Structure", *J. Materials Research*, 11, (1996),1979-1986.

Yoder, M, "Wide Bandgap Semiconductor Materials and Devices", *IEEE Transactions on Electron Devices*, 43, (Oct. 1996), 1633-1636.

Zhao, X., et al., "Nanocrystalline Si: a material constructed by Si quantum dots", *1st Int. Conf. on Low Dimensional Structures and Devices*, Singapore, (1995),467-471.

Zirinsky, S, et al., "Electrical Resistivity of Amorphous Silicon Resistor Films", *Extended Abstracts of the Spring Meeting of the Electrochemical Society*, Washington, DC,(1971),pp. 147-149.

\* cited by examiner

TRANSISTOR WITH VARIABLE ELECTRON AFFINITY GATE

RELATED APPLICATIONS

This application is a divisional of U.S. application Ser. No. 09/691,004 filed on Oct. 18, 2000, now U.S. Pat. No. 6,965,123, which is a continuation of U.S. application Ser. No. 08/903,452 filed on Jul. 29, 1997 now abandoned, the specifications of which are incorporated herein by reference.

FIELD OF THE INVENTION

The present invention relates generally to integrated circuit technology, and particularly to a silicon carbide gate transistor, such as a floating gate transistor, and complementary metal-oxide-semiconductor (CMOS) compatible methods of fabrication, and methods of use in memory and light detection devices.

BACKGROUND OF THE INVENTION

Field-effect transistors (FETs) are typically produced using a standard complementary metal-oxide-semiconductor (CMOS) integrated circuit fabrication process. Such a process allows a high degree of integration for obtaining high circuit density with relatively few processing steps. Resulting FETs typically have gate electrodes composed of n-type conductively doped polycrystalline silicon (polysilicon) material.

The intrinsic properties of the polysilicon gate material affects operating characteristics of the FET. Silicon (monocrystalline and polycrystalline) has intrinsic properties that include a relatively small energy bandgap ($E_g$), e.g. approximately 1.2 eV, and a corresponding electron affinity ($\chi$) that is relatively large, e.g. $\chi \approx 4.2$ eV. For example, for p-channel FETs fabricated by a typical CMOS process, these and other material properties result in a large turn-on threshold voltage ($V_T$) magnitude. As a result, the $V_T$ magnitude must be downwardly adjusted by doping the channel region that underlies the gate electrode of the FET.

Conventional polysilicon gate FETs also have drawbacks that arise during use as a nonvolatile storage devices, such as in electrically erasable and programmable read only memories (EEPROMs). EEPROM memory cells typically use FETs having an electrically isolated (floating) gate that affects conduction between source and drain regions of the FET. A gate dielectric is interposed between the floating gate and an underlying channel region between source and drain regions. A control gate is provided adjacent to the floating gate, separated therefrom by an intergate dielectric.

In such memory cells, data is represented by charge stored on the polysilicon floating gates. Fowler-Nordheim tunneling is one method that is used to store charge on the polysilicon floating gates during a write operation and to remove charge from the polysilicon floating gate during an erase operation. However, the relatively large electron affinity of the polysilicon floating gate presents a relatively large tunneling barrier energy at its interface with the underlying gate dielectric. The large tunneling barrier energy provides longer data retention times than realistically needed. For example, a data charge retention time at 85° C. is estimated to be in millions of years for some floating gate memory devices. The large tunneling barrier also increases the time needed to store charge on the polysilicon floating gates during the write operation and the time needed to remove charge from the polysilicon floating gate during the erase operation. This is particularly problematic for "flash" EEPROMs, which have an architecture that allows the simultaneous erasure of many floating gate transistor memory cells. Since more charge must be removed from the many floating gates in a flash EEPROM, even longer erasure times are needed to accomplish this simultaneous erasure. There is a need in the art to obtain floating gate transistors allowing faster storage and erasure, such as millisecond erasure periods in flash EEPROMs.

Other problems result from the large erasure voltages that are typically applied to a control gate of the floating gate transistor in order to remove charge from the floating gate. These large erasure voltages are a consequence of the large tunneling barrier energy between the polysilicon floating gate and the underlying gate dielectric. The large erasure voltages can result in hole injection into the gate dielectric. This can cause erratic overerasure, damage to the gate dielectric, and introduction of trapping states in the gate dielectric. The high electric fields that result from the large erasure voltages can also result in reliability problems, leading to device failure. There is a need in the art to obtain floating gate transistors that allow the use of lower erasure voltages. There is a need in the art for floating gate transistors capable of operating at lower programming and erasure voltages and having improved reliability.

Halvis et al. (U.S. Pat. No. 5,369,040) discloses a charge-coupled device (CCD) photodetector which has transparent gate MOS imaging transistors fabricated from polysilicon with the addition of up to 50% carbon, and preferably about 10% carbon, which makes the gate material more transparent to the visible portion of the energy spectrum. The Halvis et al. patent is one example of a class of conventional CCD photodetectors that are directed to improving gate transmissivity to allow a greater portion of incident light in the visible spectrum to penetrate through the gate for absorption in the semiconductor substrate. However, the absorption of photons in the semiconductor substrate is limited to high energy photons exceeding a bandgap energy of the semiconductor substrate. There is a need in the art to detect lower energy photons independently of the semiconductor bandgap energy limitation. For the reasons stated above, and for other reasons stated below which will become apparent to those skilled in the art upon reading and understanding the present specification, the above described needs are unresolved in the art of fabrication of light detection devices, FETs, and EEPROMs using CMOS processes.

BRIEF DESCRIPTION OF THE DRAWINGS

In the drawings, like numerals describe substantially similar components throughout the several views.

DETAILED DESCRIPTION OF THE INVENTION

Figure 1:
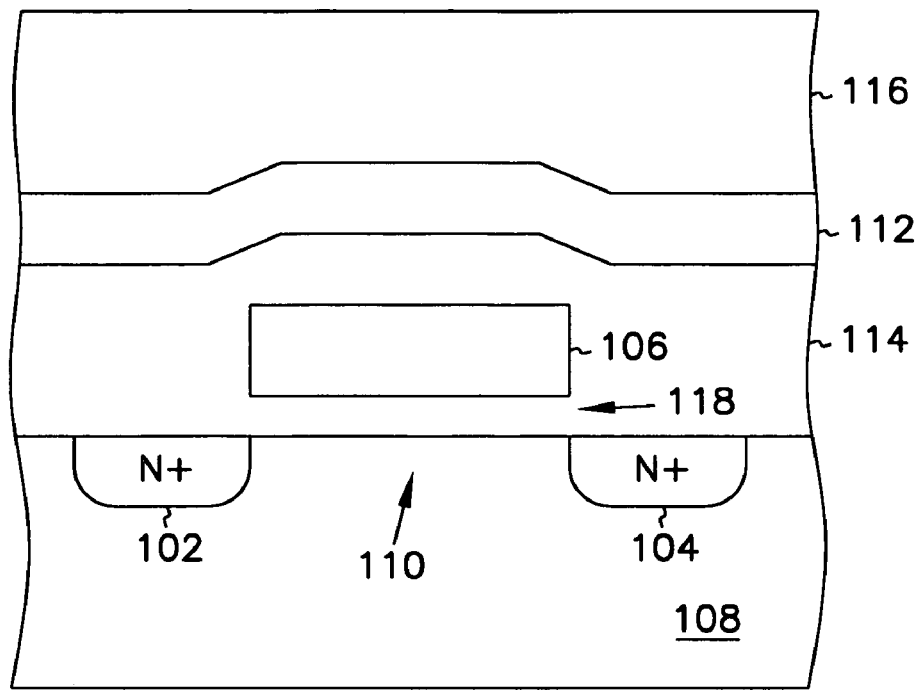
FIG. 1 is a cross-sectional view illustrating generally one embodiment of a FET provided by the invention, which includes an electrically isolated (floating) or interconnected gate including a silicon carbide (SiC) compound.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. The embodiments are described in sufficient detail to enable those skilled in the art to practice the invention. Other embodiments may be utilized and structural and electrical changes may be made without departing from the scope of the present invention. The terms wafer and substrate used in the following description include any semiconductor-based structure having an exposed surface with which to form the integrated circuit structure of the invention. Wafer and substrate are used interchangeably to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The following detailed description is, therefore, not to be taken in a limiting sense, and the scope of the present invention is defined only by the appended claims.

The present invention includes a field-effect transistor (FET) having a gate that is formed of at least partially crystalline (e.g., monocrystalline, polycrystalline, microcrystalline, or nanocrystalline) diamond-like silicon carbide (SiC) material, which includes any material that incorporates both silicon and carbon into the gate region of a FET. The SiC gate FET includes characteristics such as, for example, a lower electron affinity than a conventional polycrystalline silicon (polysilicon) gate FET. Another aspect of the invention provides a tailored SiC material composition for use in conjunction with a particular gate dielectric, or for particular applications, such as data storage (memory) and imaging.

The present invention includes a transistor having a gate formed of a silicon carbide compound $Si_{1-x}C_x$, wherein x is selected at a predetermined value approximately between 0 and 1.0 to establish a desired value of a baffler energy between the gate and an adjacent insulator. The SiC gate is either electrically isolated (floating) or interconnected. In one embodiment, the gate is an electrically isolated floating gate, and the transistor further includes a control gate, separated from the floating gate by an intergate dielectric.

Another aspect of the invention provides a method of producing a transistor on a semiconductor substrate. Source and drain regions are formed, thereby defining a channel region between the source and drain regions. An insulating layer is formed on the channel region. A gate is formed on the insulating layer. The gate comprises a silicon carbide compound $Si_{1-x}C_x$. The SiC composition x is selected at a predetermined value approximately between 0 and 1.0. In one embodiment, the value of the SiC composition x is selected to establish the value of a baffler energy between the gate and the insulator.

Another aspect of the invention provides light detection. Charge is stored on a floating gate of a transistor. Incident light is received at the floating gate, thereby removing at least a portion of the stored charge from the floating gate by the photoelectric effect. A change in conductance between the transistor source and drain is detected. In one embodiment, the method of detecting light includes selecting at least one wavelength of the incident light to which the floating gate transistor is most sensitive. In another light detecting embodiment, the invention provides a transistor that includes a floating gate separated from a channel region by an insulator. The floating gate is formed of a silicon carbide compound $Si_{1-x}C_x$. The SiC composition variable x is selected at a predetermined value approximately between 0 and 1.0 to establish the wavelength of incident light absorption to which the floating gate is sensitive. Charge is stored on the floating gate. Incident light is received at the floating gate, thereby removing at least a portion of the stored charge from the floating gate by the photoelectric effect. A change in conductance between the transistor source and drain is detected. Unlike conventional photodetectors, light is absorbed in the floating gate, thereby ejecting previously stored electrons therefrom. Also unlike conventional photodetectors, the light detector according to the present invention is actually more sensitive to lower energy photons as the semiconductor bandgap is increased.

In another embodiment, the transistor is used in a memory device that includes a plurality of memory cells. Each memory cell includes a transistor having a floating gate separated from the channel region by an insulator. The floating gate is formed of a silicon carbide compound $Si_{1-x}C_x$, wherein x is selected at a predetermined value approximately between 0 and 1.0 to establish a desired value of a baffler energy between the gate and the insulator.

In a flash electrically erasable and programmable read only memory (EEPROM) application, the SiC composition x is selected to provide the desired programming and erase voltage and time or data charge retention time. The lower baffler energy and increased tunneling probability of the SiC gate advantageously provides faster programming and erasure times for floating SiC gate transistors in flash EEPROM memories. This is particularly advantageous for "flash" EEPROMs in which many floating gate transistor memory cells must be erased simultaneously. Writing and erasure voltages are also advantageously reduced, minimizing the need for complicated and noisy on-chip charge pump circuits to generate the large erasure voltage. Lower erasure voltages also reduce hole injection into the gate dielectric that can cause erratic overerasure, damage to the gate dielectric, and introduction of trapping states in the gate dielectric. Reducing the erasure voltage also lowers the electric fields, minimizing reliability problems that can lead to device failure, and better accommodating downward scaling of device dimensions. Data charge retention time is decreased. Since conventional data charge retention times are longer than what is realistically needed, a shorter data charge retention time can be accommodated in order to obtain the benefits of a smaller baffler energy. The data charge retention time can be selected between seconds and millions of years by selecting the value of the SiC composition x, such as to obtain different memory functionality.

FIG. 1 is a cross-sectional view illustrating generally, by way of example, one embodiment of a n-channel FET provided by the invention. The invention is understood to also include a p-channel FET embodiment. The n-channel FET includes a source 102, a drain 104, and a gate 106. A gate dielectric, such as thin oxide layer 118 or other suitable insulator, is interposed between gate 106 and substrate 108. In one embodiment, source 102 and drain 104 are fabricated by forming highly doped (n+) regions in a lightly doped (p−) silicon semiconductor substrate 108. In another embodiment, substrate 108 includes a thin semiconductor surface layer formed on an underlying insulating portion, such as in a semiconductor-on-insulator (SOI) or other thin film transistor technology. Source 102 and drain 104 are separated by a predetermined length in which a channel region 110 is formed.

According to one aspect of the invention, gate 106 is formed of silicon carbide (SiC) material, which includes any material that incorporates both silicon and carbon into gate 106. The silicon carbide material forming gate 106 is described more generally as $Si_{1-x}C_x$, where x is a composition variable that defines the SiC material composition. According to another aspect of the invention, the SiC composition x is selected at a predetermined value that establishes the value of a barrier energy (also referred to as a barrier potential, potential barrier, tunneling barrier, interface barrier, or barrier) between gate 106 and thin oxide layer 118 (or other gate dielectric). For example, in one embodiment, the SiC composition is approximately stoichiometric, i.e., x≈0.5. However, other embodiments of the invention include less carbon (i.e., x <0.5) or more carbon (i.e., x>0.5). For example, but not by way of limitation, one embodiment of the SiC gate material is illustrated by 0.1<x<0.5. Another example embodiment is illustrated by way of example, but not by way of limitation, by 0.4<x <0.6. Still another embodiment is illustrated by way of example, but not by way of limitation, by 0.5<x<1.0. As described below, the SiC composition x is selected as a predetermined value in order to tailor the barrier for particular applications. In one embodiment, the SiC composition x is uniform over a particular integrated circuit die. In another embodiment, the SiC composition x is differently selected at different locations on the integrated circuit die, such as by additional masking or processing steps, to obtain different device characteristics on the same integrated circuit die.

In one embodiment, an insulating layer, such as silicon dioxide (oxide) 114 or other insulating layer, is formed by chemical vapor deposition (CVD). Oxide 114 isolates gate 106 from other layers, such as layer 112. In another embodiment, gate 106 is oxidized to form at least a portion of oxide 114 isolating gate 106 from other layers such as layer 112. In one embodiment, for example, layer 112 is a polysilicon or other control gate in a floating gate transistor. According to techniques of the present invention, the floating gate transistor is used in an electrically erasable and programmable read-only memory (EEPROM) memory cell, such as a flash EEPROM, or in a floating gate transistor photodetector or imaging device, as described below. In these embodiments, gate 106 is floating (electrically isolated) for charge storage thereupon. The present invention offers considerable advantages to the known EEPROM techniques used for charge storage on floating gate 106. In another embodiment, for example, layer 112 is a metal or other conductive interconnection line that is located above gate 106.

The upper layers, such as layer 112 are covered with a layer 116 of a suitable insulating material in the conventional manner, such as for isolating and protecting the physical integrity of the underlying features. Gate 106 is isolated from channel 110 by an insulating layer such as thin oxide layer 118, or any other suitable dielectric material. In one embodiment, thin oxide layer 118 is a gate oxide layer that can be approximately 100 angstroms (Å) thick, such as for conventional FET operation. In another embodiment, such as in a floating gate transistor, thin oxide layer 118 is a tunnel oxide material that can be approximately 50–100 Å thick.

The SiC gate 106 has particular advantages over polysilicon gates used in floating gate and conventional FETs fabricated using a conventional complementary metal-oxide-semiconductor (CMOS) process due to different characteristics of the SiC material. For example, stoichiometric SiC (x≈0.5) is a wide bandgap semiconductor material with a bandgap energy of about 2.1 eV, in contrast to silicon (monocrystalline or polycrystalline), which has a bandgap energy of about 1.2 eV. Stoichiometric SiC has an electron affinity of about 3.7 to 3.8 eV, while silicon has an electron affinity of about 4.2 eV.

The smaller electron affinity of the SiC gate 106 material reduces the barrier energy at the interface between gate 106 and thin oxide layer 118. In an embodiment in which thin oxide layer 118 is a tunnel oxide in a floating gate transistor EEPROM memory cell, the lower electron affinity of SiC reduces the tunneling distance and increases the tunneling probability. This speeds the write and erase operations of storing and removing charge to and from floating gate 106. This is particularly advantageous for "flash" EEPROMs in which many floating gate transistor memory cells must be erased simultaneously. The large charge that must be transported by Fowler-Nordheim tunneling during the erasure of a flash EEPROM typically results in relatively long erasure times. By reducing the tunneling distance and increasing the tunneling probability, the SiC gate 106 reduces erasure times in flash EEPROMs.

According to one aspect of the present invention, the exact value of the SiC composition x is selected to obtain the desired barrier potential for the particular application. The predetermined value the SiC composition x establishes the particular electron affinity, $\chi$ such as between that of stoichiometric SiC (about 3.7 to 3.8 eV) and a value $\chi$<0 eV. As a result, the barrier energy is further decreased from that of stoichiometric SiC by the exact amount desired. This speeds storage and removal of charge to and from the floating gate 106 during write and erase operations.

Lowering the barrier potential also decreases the data charge retention time of the charge stored on the floating gate 106. Conventional polysilicon floating gates have a data charge retention time estimated in the millions of years at a temperature of 85 degrees C. Since such long data charge retention times are longer than what is realistically needed, a shorter data charge retention time can be accommodated in order to obtain the benefits of a smaller barrier energy. According to one aspect of the present invention, the SiC composition x is selected to establish the particular data charge retention time. For example, the data charge retention time can be selected between seconds and millions of years.

FIG. 1 illustrates generally, by way of example, a complementary metal-oxide-semiconductor (CMOS) compatible n-channel FET that includes an SiC gate 106, which may be floating or electrically interconnected. In one embodiment, for example, the FET can be formed on substrate 108 using an n-well CMOS process for monolithic CMOS fabrication of n-channel and p-channel FETs on a common substrate. The invention includes both n-channel and p-channel FETs that have a polycrystalline or microcrystalline SiC gate 106. Thus, with appropriate doping, the FET of FIG. 1 can be a p-channel FET. The p-channel and n-channel SiC gate FETs are useful for any application in which conventionally formed polysilicon gate FETs are used, including both electrically driven and floating gate applications.

Figure 2:
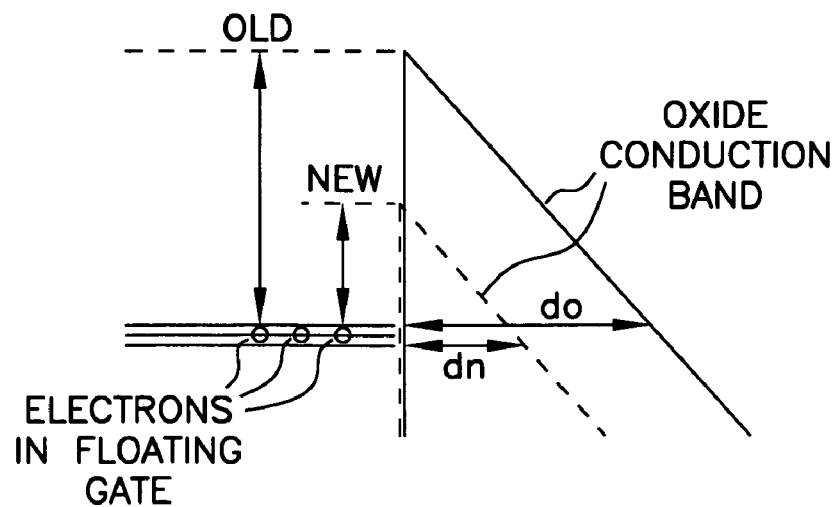
FIG. 2 is a graph illustrating generally barrier energy versus tunneling distance for SiC and conventional polysilicon gates.

FIG. 2 illustrates generally how the smaller SiC electron affinity provides a smaller barrier energy than a conventional polysilicon gate. The smaller SiC barrier energy reduces the energy to which the electrons must be excited to be stored on the SiC gate 106 by thermionic emission. The smaller barrier energy also reduces the distance that electrons stored on the gate have to traverse, such as by Fowler-Nordheim tunneling, to be stored upon or removed from the SiC gate 106. The reduced tunneling distance allows easier charge transfer, such as during writing or erasing data in a floating gate transistor in a flash EEPROM memory cell. In FIG. 2, "do" represents the tunneling distance of a typical polysilicon floating gate transistor due to the barrier height represented by the dashed line "OLD". The tunneling distance "dn" corresponds to a SiC gate and its smaller barrier height represented by the dashed line "NEW". Even a small reduction in the tunneling distance results in a large increase in the tunneling probability, because the tunneling probability is an exponential function of the reciprocal of the tunneling distance. The increased tunneling probability of the SiC gate 106 advantageously provides faster programming and erasure times for floating SiC gate transistors in flash EEPROM memories. The smaller bandgap of floating SiC gate transistors have a smaller turn-on threshold voltage magnitude, thereby also allowing operation of such flash EEPROM memories at lower power supply voltages.

Figure 3A:
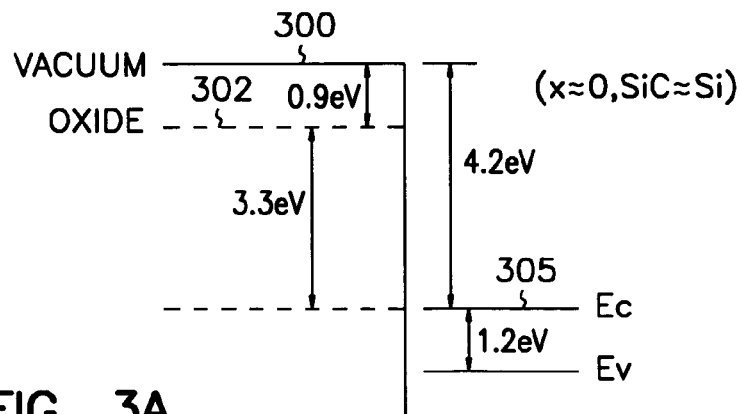
FIGS. 3A, 3B, and 3C illustrate generally electron affinities of various SiC compositions and of silicon dioxide, and the resulting interfacial barrier energy therebetween.
Figure 3B:
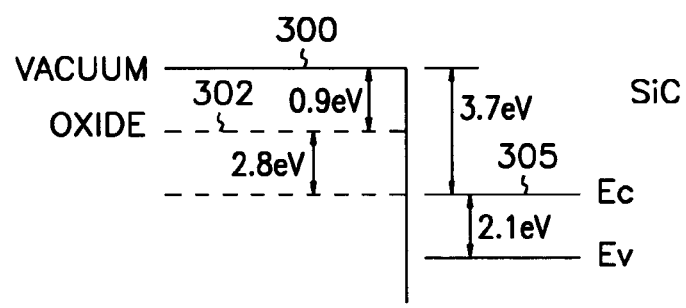
Figure 3C:
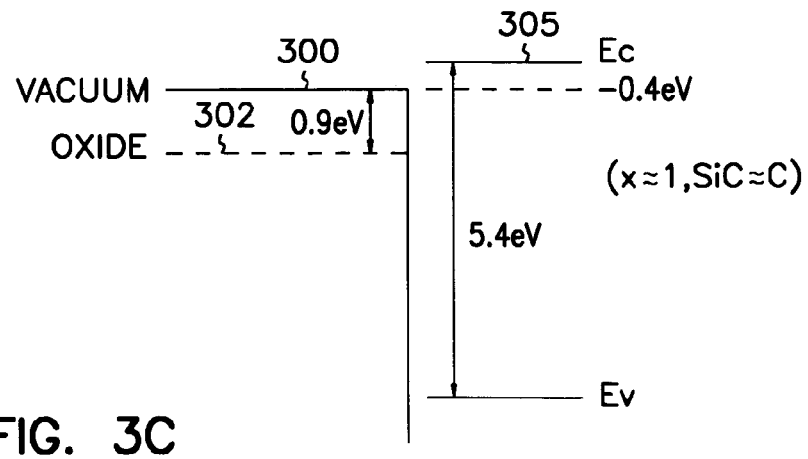

FIGS. 3A–3C illustrate generally by way of example, but not by way of limitation, different selections of the predetermined value of the SiC composition x. Differently selected values of the SiC composition x provide different resulting barrier energies at the interface between gate 106 and the adjacent thin oxide layer 118 (or other gate or tunneling dielectric). FIGS. 3A–3C illustrate, by way of example, but not by way of limitation, the use of a silicon dioxide gate insulator such as thin oxide layer 118. However, the invention includes the use of any other gate insulator materials in combination with the SiC gate 106.

In FIGS. 3A–3C, the electron affinities, $\chi$ of each of the thin oxide layer 118 and SiC gate 106 are measured with respect to the vacuum level 300. In the thin oxide layer 118, the electron affinity, $\chi$ is defined by the difference between the oxide conduction band 302 and the vacuum level 300. In the SiC gate 106, the electron affinity, $\chi$ is defined by the difference between the semiconductor conduction band edge 305 and the vacuum level 300. The barrier energy at the interface between thin oxide layer 118 and SiC gate 106 is illustrated by the difference between their respective electron affinities, $\chi$.

In FIG. 3A, the SiC composition is selected at x≈0, which is an extreme limit in which the SiC gate 106 material composition is approximately pure silicon (e.g., polycrystalline or microcrystalline). As seen in FIG. 3A, the resulting electron affinity in the gate 106 material is $\chi \approx 4.2$ eV. The electron affinity in thin oxide layer 118 is $\chi \approx 0.9$ eV. The resulting barrier energy is approximately 3.3 eV. In a memory application using a floating gate 106, the 3.3 eV barrier energy results in long data charge retention times (estimated in millions of years at a temperature of 85 degrees C.) together with large erasure voltages and long write and erase times. In an imaging application using a floating gate 106, the 3.3 eV barrier energy requires relatively high energy photons (i.e., high frequency and short wavelength) to eject stored electrons from the floating gate 106.

In FIG. 3B, the SiC composition is selected at x≈0.5, for which the SiC gate 106 material is approximately stoichiometric SiC. As seen in FIG. 3B, the resulting electron affinity in the gate 106 material is $\chi \approx 3.7$ eV. The electron affinity in thin oxide layer 118 is $\chi \approx 0.9$ eV. The resulting barrier energy is approximately 2.8 eV. In a memory application using a floating gate 106, the 2.8 eV barrier energy results in shorter charge retention times than are obtained than in the case described with respect to FIG. 3A, together with smaller erasure voltages and shorter write and erase times. In an imaging application using a floating gate 106, the 2.8 eV barrier energy needs less photon energy (i.e., lower frequency and longer wavelength) to eject electrons from the floating gate 106 than in the case described with respect to FIG. 3A.

In FIG. 3C, the SiC composition is selected at x≈1, which is an extreme limit in which the material is substantially pure carbon (i.e., diamond). As seen in FIG. 3C, the resulting electron affinity in the gate material is $\chi \approx -0.4$ eV. The electron affinity in the silicon dioxide insulator 118 is $\chi \approx 0.9$ eV. The resulting barrier energy is approximately −1.3 eV. In this case, electrons will not stay in the conduction band of the diamond gate 106 material, but will instead move into the thin oxide layer 118.

Thus, the barrier energy at the interface between thin oxide layer 118 and SiC gate 106 is adjusted by tuning the SiC composition x. The SiC gate material compounds can be doped p-type or n-type, either during formation or by a subsequent doping step. However, the SiC films are quite conductive even when intrinsic. In floating gate applications, the SiC films need not be very conductive since they are not used for interconnection wiring. An SiC floating gate 106 need only allow for redistribution of carriers in the floating gate 106. Microcrystalline SiC compounds have a smaller electron affinity than polycrystalline SiC compounds. In one embodiment of the present invention, the barrier potential is adjusted by selecting between microcrystalline and polycrystalline SiC compounds for the gate 106 material.

Floating Gate Memory Device

Figure 4:
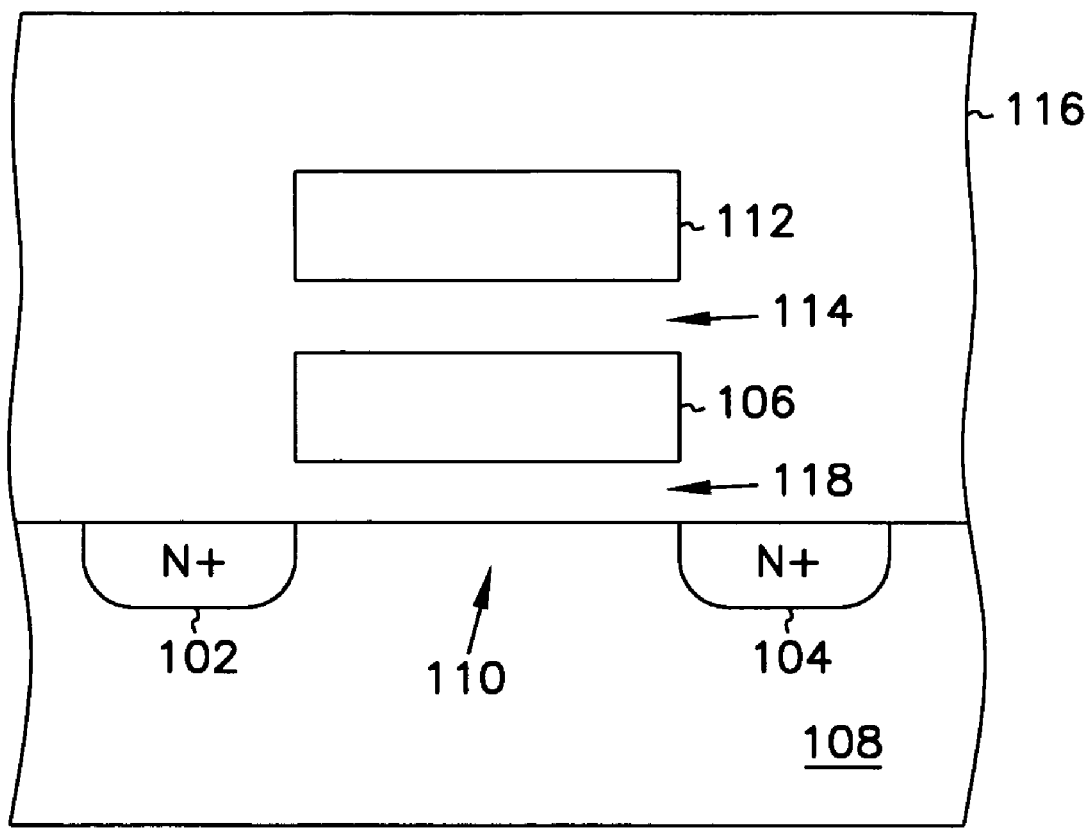
FIG. 4 is a cross-sectional view illustrating generally a variable electron affinity floating SiC gate field-effect transistor (FET) provided by the invention.

FIG. 4 is a cross-sectional view of a transistor, similar to that of FIG. 1, illustrating generally a floating gate transistor embodiment of the invention, such as for use as a nonvolatile memory cell in a flash EEPROM. In one embodiment, floating gate 106 is a polycrystalline or microcrystalline SiC compound for which 0.5<x<1.0.

By using polycrystalline or microcrystalline SiC for floating gate 106, a lower barrier energy is obtained at the interface between gate 106 and thin oxide layer 118. The exact barrier energy is established by selecting the predetermined value of the SiC composition x. The lower barrier energy provides a larger tunneling probability during write and erase operations. Write and erasure voltages and times are reduced. Secondary problems that are normally associated with erasure of charge stored on polysilicon gates, such as electron trap creation and hole injection, are correspondingly reduced along with the erasure voltage.

In one embodiment, the exact value of the SiC composition x is selected to establish a barrier energy that is large enough to prevent electrons from being thermally excited over the barrier at high operating temperatures, such as at a temperature of 85° C., as this could allow the stored data charges to leak from the floating gate over a long period of time. The high barrier energy of a polysilicon floating gate material provides a longer than realistically needed data charge retention time that is estimated in millions of years. The SiC composition x is selected to obtain a lower barrier energy, providing data retention times that are more suited to the particular application. In one embodiment of the present invention, the SiC composition x is selected to obtain typical data charge retention times between seconds and millions of years.

In one embodiment, the invention includes operation of a SiC floating gate transistor memory device. Floating gate 106 can be programmed, by way of example, but not by way of limitation, by providing about 12 volts to control gate 112, and providing about 6 volts to drain 104, and providing about 0 volts to source 102. This creates an inversion layer in channel region 110, in which electrons are accelerated from source 102 toward drain 104, acquiring substantial kinetic energy. High energy "hot electrons' are injected through thin oxide layer 118 onto the polycrystalline or microcrystalline SiC floating gate 106. Floating gate 106 accumulates the hot electrons as stored data charges.

The change in the charge stored on floating gate 106 changes the threshold voltage of the n-channel floating gate FET of FIG. 4. When control gate 112 is driven to a read voltage during a read operation, the change in charge stored on floating gate 106 results in a change in current between drain 104 and source 102. Thus, detection of the change in charge stored on floating gate 106 by sensing drain-source current conductance advantageously uses the appreciable transconductance gain of the floating gate FET of FIG. 4. Either analog or digital data can be stored as charge on floating gate 106 and read back as a conductance between drain region 104 and source region 102.

The erase time for the memory cell is determined by the height of the barrier between floating gate 106 and thin oxide layer 118. A lower barrier energy results in a shorter tunneling distance, as described with respect to FIG. 2. This, in turn, results in a faster erase operation, lower erasure voltages, or both faster erase operation and lower erasure voltages. Short erase times are normally particularly desirable in flash memories, in which many memory cells must be simultaneously erased. However, a lower barrier energy also means a shorter data charge retention time due to thermal excitation of electrons over or tunneling of electrons through the barrier.

According to the invention, the barrier energy is varied by changing the SiC composition x. By selecting the predetermined value of the SiC composition x, the data charge retention time can be established at a value that is, for example, between seconds and millions of years. By changing the SiC composition x, a flash memory device that incorporates the SiC floating gate transistor provides a data charge retention time that is tailored to the particular application.

For example, by setting the SiC composition at about $0.75<x<1.0$, the flash memory device can be made to emulate a dynamic random access memory (DRAM), with data charge retention times on the order of seconds. On the other hand, for example, by setting the SiC composition at about $0.5<x<0.75$, the flash memory device can be made to emulate a hard disk drive, by providing a data charge retention time on the order of years. According to one aspect of the present invention, one memory device provides different memory functions by selecting the SiC composition x. In one embodiment, floating gate transistors having different SiC compositions x are provided on the same integrated circuit, thereby providing differently functioning memory cells on the same integrated circuit.

Figure 5:
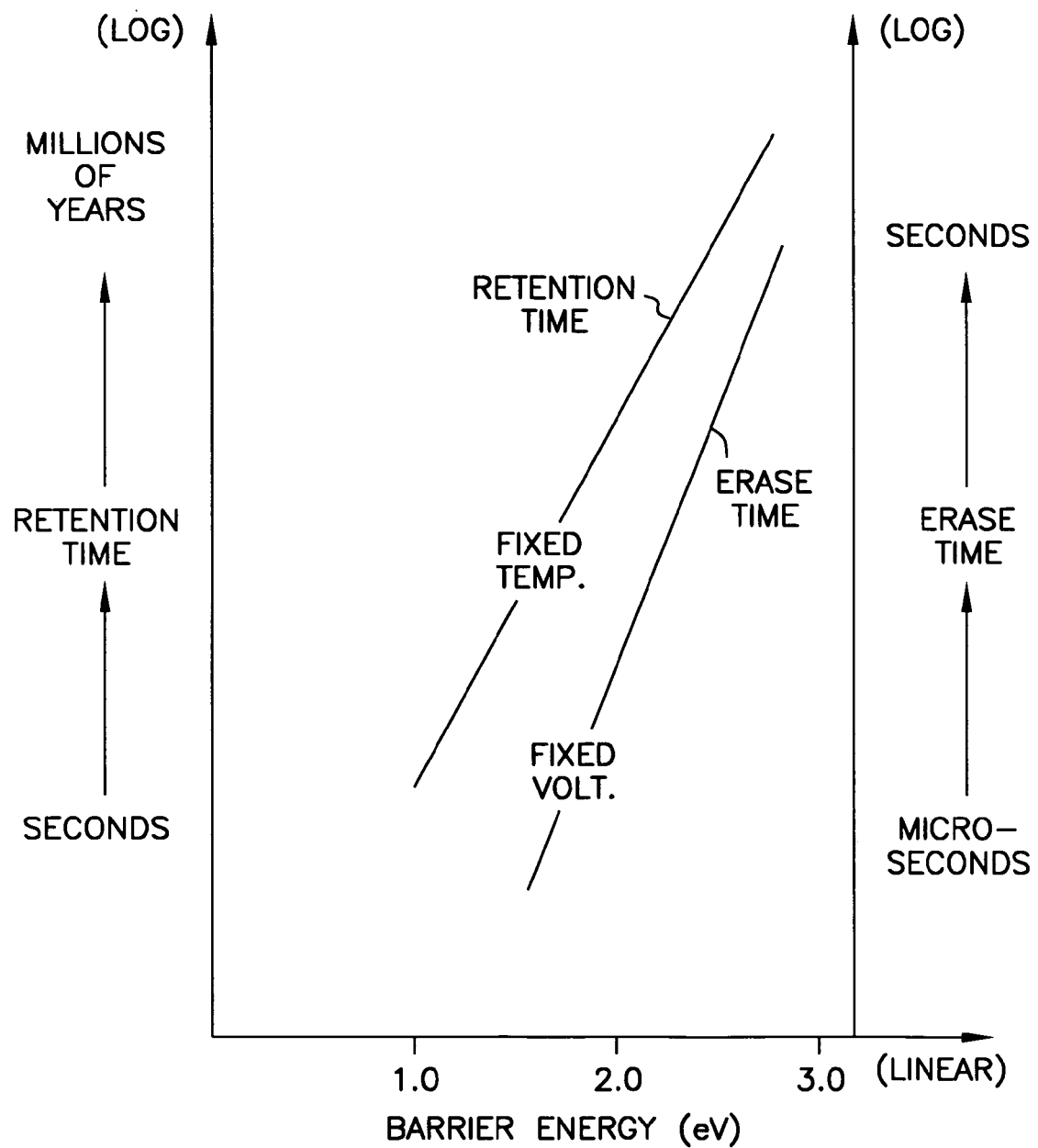
FIG. 5 is a graph that illustrates generally the relationship between retention time and barrier energy, and also the relationship between erase time and barrier energy.

FIG. 5 is a conceptual diagram, using rough order of magnitude estimates, that illustrates generally how erase and retention times vary with the barrier energy for a particular value of erasure voltage at a particular temperature of 85° C. The probability of thermal excitation and emission over or tunneling through the barrier is an exponential function of the barrier energy. A lower barrier provides exponentially shorter erase and retention times. The particular memory application requirements determine the needed memory retention time, whether seconds or years. From this memory retention time, the barrier energy required and the erase time for a particular voltage can be determined using an engineering graph similar to that of FIG. 5. Thus, the SiC composition x is selected to provide a retention time on the order of seconds or years, depending upon the function required for the memory device. According to one aspect of the present invention, for example, the memory device can emulate or replace DRAMs or hard disk drives by selecting the SiC composition x to establish the appropriate data charge retention time.

Figure 6:
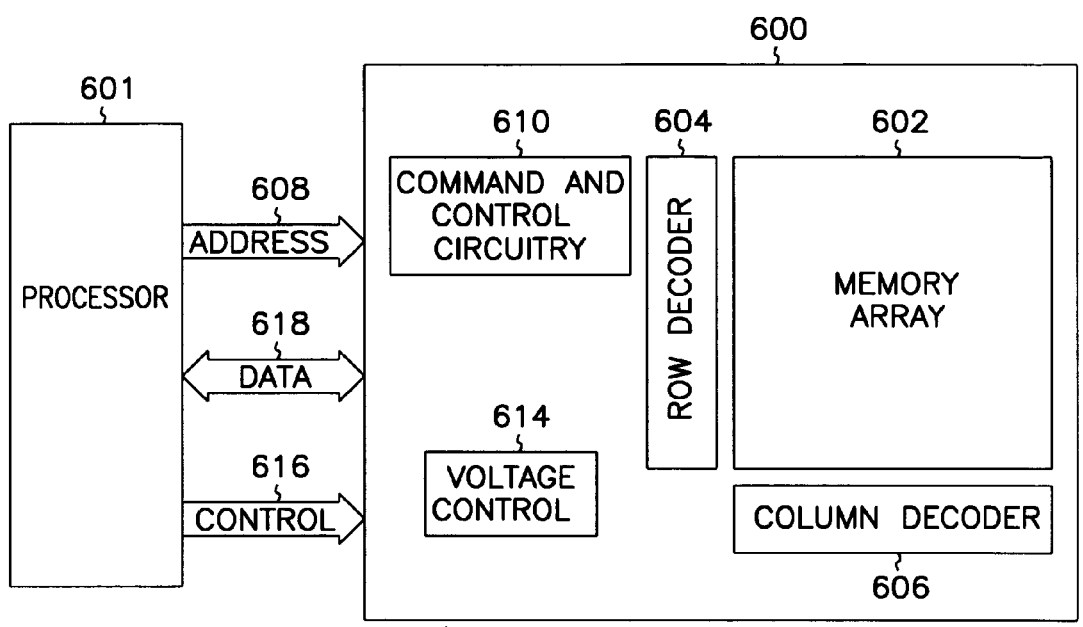
FIG. 6 illustrates generally a flash EEPROM memory having memory cells that include an SiC gate transistor according to the present invention.

FIG. 6 is a simplified block diagram illustrating generally one embodiment of a memory 600 system, according to one aspect of the present invention, in which SiC gate FETs are incorporated. In one embodiment, memory 600 is a flash EEPROM, and the SiC gate FETs are floating gate transistors that are used for nonvolatile storage of data as charge on the SiC floating gates. However, the SiC gate FETs can have electrically interconnected gates, and can be used in other types of memory systems, including SDRAM, SLDRAM and RDRAM devices, or in programmable logic arrays (PLAs), or in any other application in which transistors are used.

FIG. 6 illustrates, by way of example, but not by way of limitation, a flash EEPROM memory 600 comprising a memory array 602 of multiple memory cells. Row decoder 604 and column decoder 606 decode addresses provided on address lines 608 to access addressed SiC gate floating gate transistors in the memory cells in memory array 602. Command and control circuitry 610 controls the operation of memory 600 in response to control signals received on control lines 616 from a processor 601 or other memory controller during read, write, and erase operations. Voltage control 614 is provided to apply appropriate voltages to the memory cells during programming and erasing operations. It will be appreciated by those skilled in the art that the memory of FIG. 6 has been simplified for the purpose of illustrating the present invention and is not intended to be a complete description of a flash EEPROM memory.

Floating Gate Imaging Device

According to another aspect of the present invention, the SiC floating gate transistor of FIG. 4 is used in light detection applications, such as a photodetector or imaging device. In this embodiment of the invention, light is detected by the absorption of photons by the SiC floating gate 106. This is distinguishable from other types of imaging devices, such as sensors using a charge-coupled device (CCD) or a photodiode detector, in which light is absorbed in the semiconductor substrate, thereby producing charge carriers that are detected.

According to one embodiment of the present invention, charge is stored on the SiC floating gate 106, such as by known EEPROM charge storage techniques. The imaging device is exposed to incident light. Incident photons having enough energy to eject an electron by photoelectric emission from floating gate 106 are detected by a resulting change in drain-source conductance of the imaging device. Thus, the light detector of the present invention advantageously utilizes the transconductance gain of the floating gate transistor. In one embodiment of the invention, the wavelength to which the light detector is sensitive is established by selecting the SiC composition x of floating gate 106.

Figure 7:
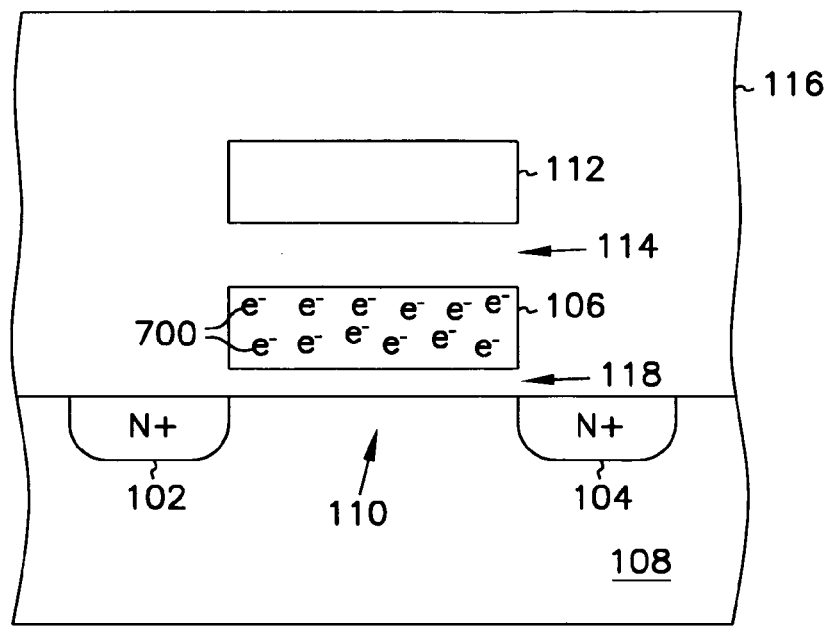
FIG. 7 is a cross-sectional schematic diagram of the floating gate transistor that illustrates generally its application according to the present invention as a light detector or imaging device.

FIG. 7 is a cross-sectional schematic diagram of the floating gate transistor that illustrates generally its application according to the present invention as a light detector or imaging device. In FIG. 7, floating gate 106 is charged by the injection of hot electrons 700 through thin oxide layer 118 under the SiC floating gate 106. This change in charge on floating gate 106 changes the threshold voltage of the n-channel floating gate FET. As a result, when control gate 112 is driven to a read voltage during a read operation, a large change in drain-source current is obtained through the transconductance gain of the floating gate transistor.

Figure 8:
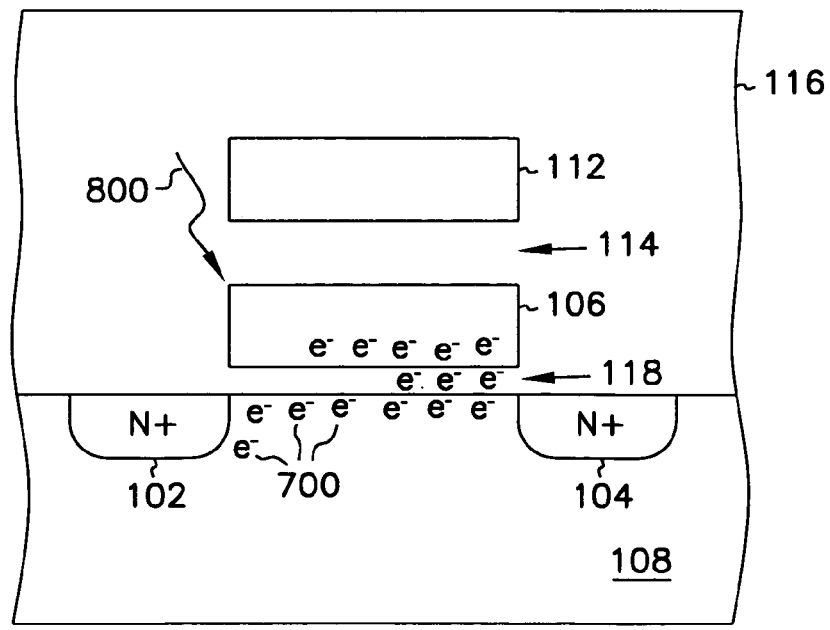
FIG. 8 is a cross-sectional schematic diagram that illustrates generally how incident light is detected by the absorption of photons by the floating gate.

FIG. 8 is a cross-sectional schematic diagram that illustrates generally how incident light 800 is detected by the absorption of photons by floating gate 106. The photons must have enough energy to cause electrons 700 stored on floating gate 106 to overcome the barrier at the interface between floating gate 106 and thin oxide layer 118 and be ejected from floating gate 106 back into the semiconductor or SOI substrate by the photoelectric effect. A small electric field in thin oxide layer 118, such as results from the presence of electrons 700 stored on floating gate 106, assists in ejecting the electrons 700 toward substrate 108. Detection or imaging of visible wavelengths of incident light 800 requires a low electron affinity floating gate 106. The present invention allows the electron affinity of floating gate 106 to be tailored by selecting the particular value of the SiC composition of floating gate 106.

Figure 9:
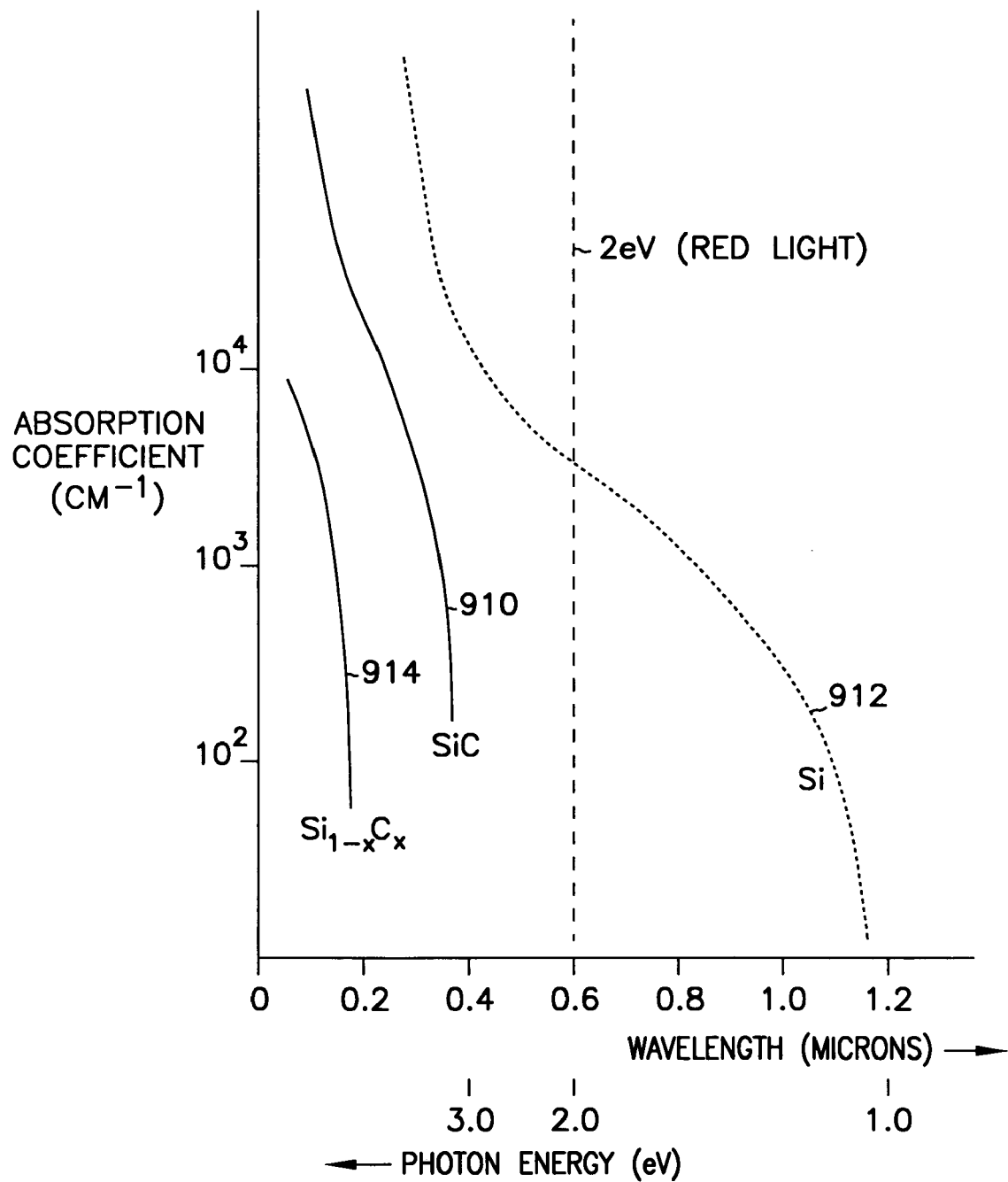
FIG. 9 is a graph that illustrates generally, by way of example, the SiC absorption coefficient as a function of wavelength and photon energy.

FIG. 9 is a graph that illustrates generally, by way of example, the SiC absorption coefficient as a function of wavelength and photon energy. Several values of the SiC composition x are illustrated, where 0<x<1.0. For example, by setting the SiC composition x≈0.5 (i.e., approximately stoichiometric SiC), the resulting light absorption is illustrated generally by line 910. In another example, by setting the SiC composition x≈0 (i.e., approximately pure polycrystalline or microcrystalline Si), the resulting light absorption is illustrated generally by line 912. In yet another example, by setting the SiC composition described approximately by 0.5<x<1.0, the resulting light absorption is illustrated generally by line 914.

Figure 10:
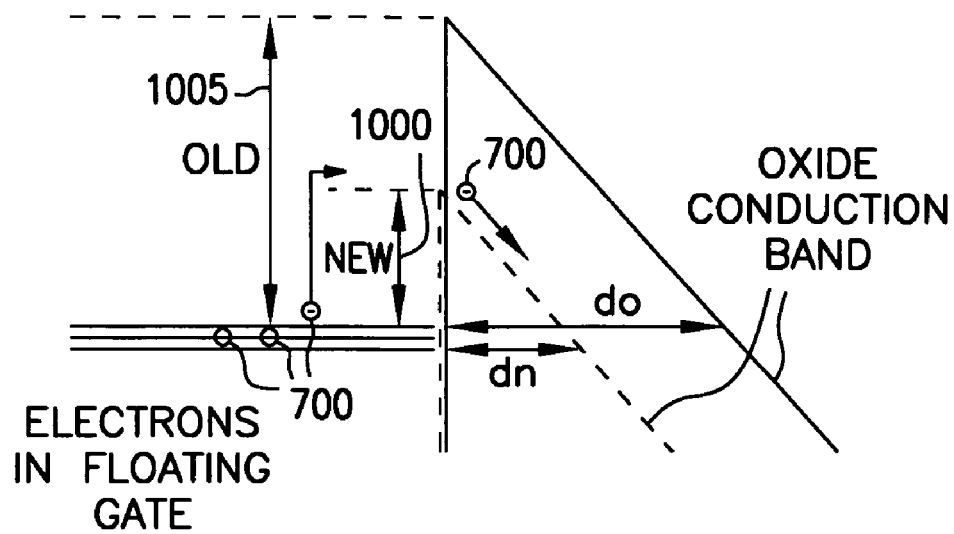
FIG. 10 is a graph illustrating generally barrier height versus tunneling distance, and further illustrating the absorption of light energy by the floating gate.

FIG. 10 further illustrates the absorption of light energy by floating gate 106. In FIG. 10, the incident photons have sufficient energy to allow electrons 700 stored on floating gate 106 to overcome the "new" barrier 1000 such that they are emitted from floating gate 106 back toward the semiconductor or SOI substrate 108, thereby discharging floating gate 106. "Old" barrier 1005, which represents a Si—SiO$_2$ interface, is higher than "new" barrier 1000 of the SiC—SiO$_2$ interface. As a result, a light detector having an SiC floating gate 106 is sensitive to lower energy photons than a light detector having an Si floating gate.

In one embodiment, SiC floating gate 106 is doped n-type to maximize the number of conduction band electrons 700 in floating gate 106 and the absorption of incident light. Visible light has a photon energy of about 2 eV. For detection of visible light, the barrier energy at the interface between floating gate 106 and thin oxide layer 118 should be less than or equal to about 2 eV. However, most common gate materials have larger barrier energies with an adjacent silicon dioxide insulator. For example, a conventional polysilicon floating gate 106 results in a barrier energy of about 3.3 eV.

According to one aspect of the present invention, polycrystalline or microcrystalline SiC is used as the material for floating gate 106. The SiC composition x is selected for sensitivity to particular wavelengths of light, and the barrier energy is established accordingly. For example, in one embodiment, the SiC composition x is selected in the range 0.5<x<1.0 such that barrier energy is less than or equal to about 2 eV. As a result, the floating gate transistor light detector is sensitive to visible light. According to another aspect of the invention, the floating gate transistor light detector is made sensitive to different portions of the light spectrum by adjusting the barrier energy through the selection of the SiC composition x. The SiC composition x can also be different for different floating gate transistors on the same integrated circuit in order to yield different sensitivities to different wavelengths of light.

Figure 11:
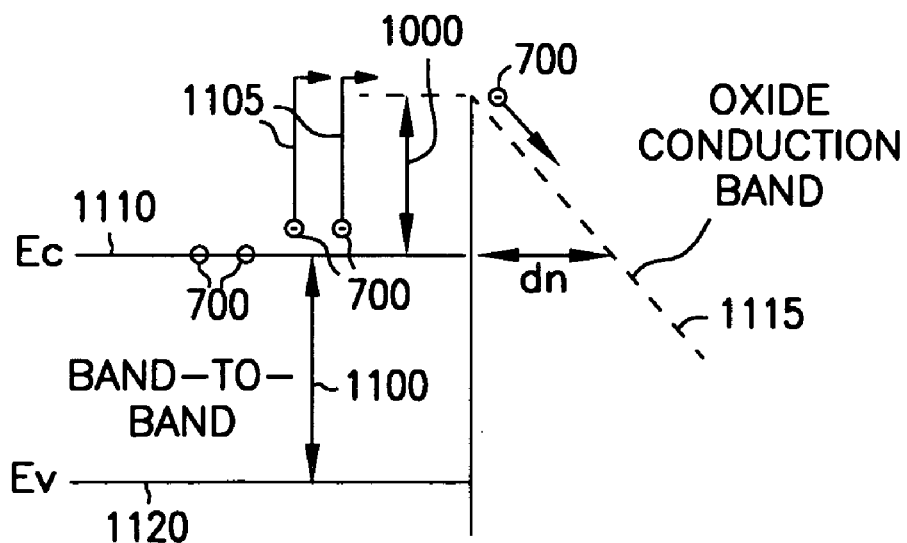
FIG. 11 is a graph illustrating generally barrier height versus tunneling distance, and distinguishing photoelectric absorption of incident light in the SiC floating gate from valence-to-conduction band electron transitions.

FIG. 11 illustrates generally how the above-described photoelectric absorption of incident light in the SiC floating gate 106 is distinguishable from, and independent of, valence-to-conduction band electron transitions, which is the common photon absorption mechanism of most diode or CCD photodetectors or imaging devices. Conventional photon absorption is illustrated by the band-to-band electron energy transition 1100. Photon absorption according to the present invention is illustrated by the emission 1105 of a conduction band electron 700 from floating gate 106 over the barrier 1000 between the floating gate semiconductor conduction band 1110 and oxide conduction band 1115.

The semiconductor bandgap is defined by the energy difference between semiconductor conduction band 1110 and semiconductor valence band 1120. Exciting an electron from the valence band 1120 low energy state to a conduction band 1110 high energy state requires absorption of an incident photon of energy exceeding the bandgap of the semiconductor material. For diamond-like SiC compounds, these band-to-band transitions occur only at very high photon energies, such as for ultraviolet light. By contrast, photoelectric emission 1105 of electrons from floating gate 106 only requires that the incident photon energy exceed the barrier 1000 between floating gate 106 and thin oxide layer 118. Since the present invention allows the barrier 1000 energy to be less than the 2 eV energy of a visible photon by an appropriate selection of the SiC composition x, and even allows a negative barrier 1000 energy, a wide spectrum of light detection is obtained.

In conventional photodetectors, only high energy photons are detected as the bandgap is increased (i.e., as the bandgap becomes larger, first red, then blue, and finally ultraviolet light is required for band-to-band photon absorption). According to the present invention, a larger bandgap typically results in a smaller barrier 1000 energy, thereby allowing detection of even lower energy photons as the bandgap is increased (i.e., as the bandgap becomes larger, the detector becomes sensitive not only to ultraviolet, but to blue, then red, and finally to infrared wavelengths). As a result, the present invention can be used for visible and infrared light detection and imaging, including camera-like operations, and can employ lenses, shutters, or other such known imaging techniques.

FIG. 11 illustrates generally, by way of example, but not by way of limitation, the absorption of red light with photon energies of around 2 eV in the SiC floating gate 106. In one embodiment, the SiC composition x is selected such that the barrier 1000 energy between SiC floating gate 106 and thin oxide layer 118 is less than (or much less than) 2 eV, while the bandgap for the SiC floating gate 106 is much higher than 2 eV. In this embodiment, incident photons generate negligible electron-hole pairs or valence-to-conduction band transitions in floating gate 106. Instead, absorption of photons is substantially entirely the result of photoelectric emission of electrons from floating gate 106. While the quantum efficiency associated with the photoelectric effect can be low (e.g., less than one electron emitted per one hundred photons) the floating gate transistor offers appreciable transconductance gain. Emitting a single electron from the floating gate changes the number of electrons flowing out of the drain 104 by thousands. By adjusting the SiC composition x of floating gate 106, the floating gate detector device is adjusted for optimum response over almost the entire optical spectrum, from infrared through visible light to ultraviolet. In a further embodiment of the invention, sensitivity is improved by doping the SiC floating gate 106 n-type, to increase the number of conduction band electrons stored on floating gate 106.

Process

FIGS. 12A–12G illustrate generally examples of CMOS-compatible process steps for fabricating n-channel and p-channel SiC gate FETs according to the present invention, including the fabrication of SiC floating gate transistors. The transistors can be produced on a silicon or other semiconductor substrate, an SOI substrate, or any other suitable substrate 108. Only the process steps that differ from conventional CMOS process technology are described in detail.

Figure 12A:
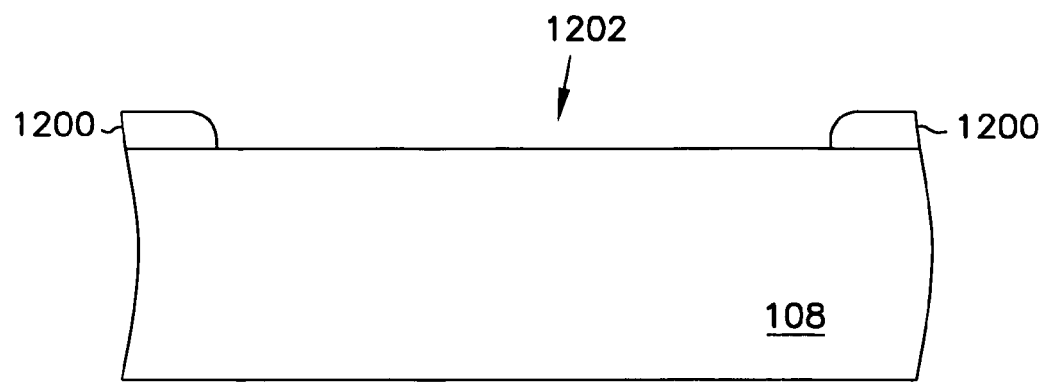
FIGS. 12A, 12B, 12C, 12D, 12E, 12F, and 12G illustrate generally examples of process steps for fabricating n-channel and p-channel SiC gate FETs according to the present invention, including the fabrication of SiC floating gate transistors.

In FIG. 12A, substrate 108 undergoes conventional CMOS processing up to the formation of the gate structure. For example, field oxide 1200 is formed for defining active regions 1202. In a bulk semiconductor embodiment, well regions are formed, such as for carrying p-channel transistors.

Figure 12B:
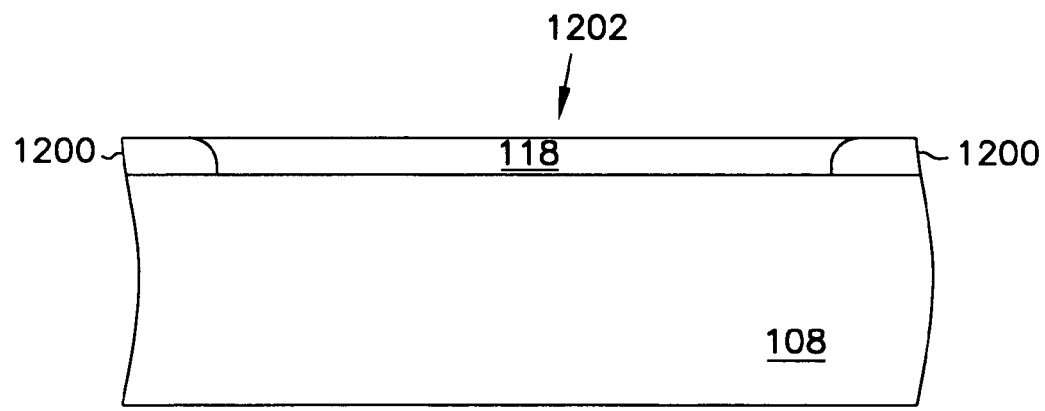

In FIG. 12B, an insulating layer, such as thin oxide layer 118 or other suitable insulator, is formed on substrate 108, such as by dry thermal oxidation, including over the portions of the active regions 1202 in which transistors will be fabricated. In one embodiment, thin oxide layer 118 is a gate oxide layer that can be approximately 100 angstroms (Å) thick. In another embodiment, such as in a floating gate transistor, thin oxide layer 118 is a tunnel oxide material that can be approximately 50–100 Å thick.

Figure 12C:
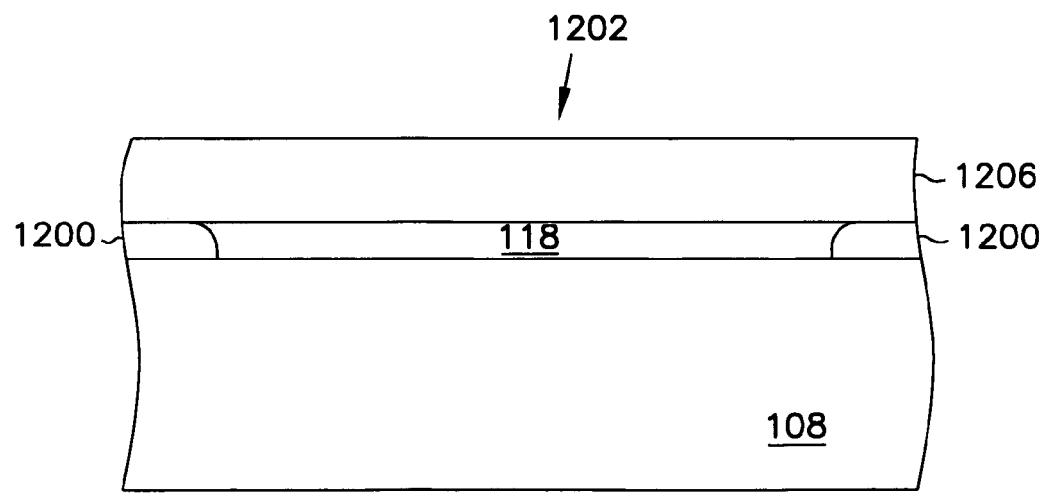

In FIG. 12C, a thin film 1206 of conductively doped polycrystalline or microcrystalline SiC is then deposited, such as by chemical vapor deposition (CVD) over the entire wafer, including over thin oxide layer 118. The SiC composition x of film 1206 is differently selected according to the particular barrier energy desired at the interface between the gate 106 and adjacent thin oxide layer 118, as described above. Microcrystalline SiC compounds may be selected for their lower electron affinity than polycrystalline SiC compounds in order to obtain the desired barrier energy.

The SiC film 1206 can be in situ doped during deposition, or doped during a subsequent ion-implantation step. The conductive doping can be n-type or p-type. In one light detecting embodiment, the SiC film 1206 is conductively doped n-type for enhanced photoelectric emission of electrons from floating gate 106 in response to incident light, as described above. In another embodiment, the SiC film 1206 is conductively doped p-type using a boron dopant, which advantageously diffuses from the SiC gate 106 less easily than from a polysilicon gate during subsequent thermal processing steps.

In one embodiment, for example, SiC film 1206 is deposited using low-pressure chemical vapor deposition (LPCVD), providing the structure illustrated in FIG. 12C. The LPCVD process uses either a hot-wall reactor or a cold-wall reactor with a reactive gas, such as a mixture of $Si(CH_3)_4$ and Ar. Examples of such processes are disclosed in an article by Y. Yamaguchi et al., entitled "Properties of Heteroepitaxial 3C—SiC Films Grown by LPCVD", in the *8th International Conference on Solid-State Sensors and Actuators and Eurosensors IX, Digest of Technical Papers*, page 3. vol. (934+1030+85), pages 190–3, Vol. 2, 1995, and in an article by M. Andrieux, et al., entitled "Interface and Adhesion of PECVD SiC Based Films on Metals", in supplement *Le Vide Science, Technique et Applications*. (France), No. 279, pages 212–214, 1996. However, SiC film 1206 can be deposited using other techniques such as, for example, enhanced CVD techniques known to those skilled in the art including low pressure rapid thermal chemical vapor deposition (LP-RTCVD), or by decomposition of hexamethyl disalene using ArF excimer laser irradiation, or by low temperature molecular beam epitaxy (MBE). Other examples of forming SiC film 1206 include reactive magnetron sputtering, DC plasma discharge, ion-beam assisted deposition, ion-beam synthesis of amorphous SiC films, laser crystallization of amorphous SiC, laser reactive ablation deposition, and epitaxial growth by vacuum anneal. The conductivity of the SiC film 1206 can be changed by ion implantation during subsequent process steps, such as during the self-aligned formation of source/drain regions for the n-channel and p-channel FETs.

Figure 12D:
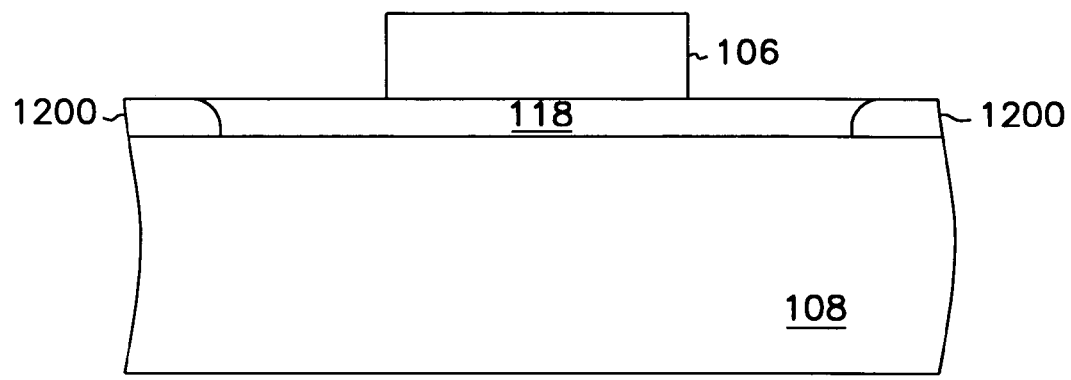

In FIG. 12D, SiC film 1206 is patterned and etched, together with thin oxide layer 118, to form SiC gate 106. SiC film 1206 is patterned using standard techniques and is etched using plasma etching, reactive ion etching (RIE) or a combination of these or other suitable methods. For example, SiC film 1206 can be etched by RIE in a distributed cyclotron resonance reactor using a $SF_6/O_2$ gas mixture using $SiO_2$ as a mask with a selectivity of 6.5. Such process is known in the art and is disclosed, for example, in an article by F. Lanois, entitled "Angle Etch Control for Silicon Power Devices", which appeared in *Applied Physics Letters*, Vol 69, No. 2, pages 236–238, July 1996. Alternatively, SiC film 1206 can be etched by RIE using the mixture $SF_6$ and $O_2$ and $F_2/Ar/O_2$. An example of such a process is disclosed in an article by N. J. Dartnell, et al., entitled "Reactive Ion Etching of Silicon Carbide" in *Vacuum*, Vol. 46, No. 4, pages 349–355, 1955. The etch rate of SiC film 1206 can be significantly increased by using magnetron enhanced RIE.

Figure 12E:
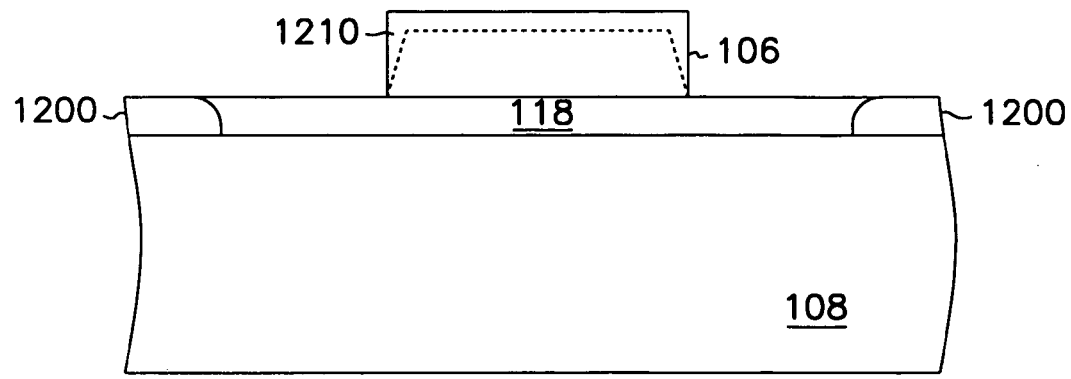

FIG. 12E illustrates one embodiment in which SiC gate 106 is oxidized after formation, providing a thin layer 1210 represented by the dashed line in FIG. 12E. SiC gate 106 can be oxidized, for example, by plasma oxidation similar to reoxidation of polycrystalline silicon. During the oxidation process, the carbon is oxidized as carbon monoxide or carbon dioxide and vaporizes, leaving the thin layer 1210 of silicon oxide over SiC gate 106. In one embodiment, thin layer 1210 is used as, or as a portion of, an intergate dielectric between floating and control gates in a floating gate transistor embodiment of the present invention.

Figure 12F:
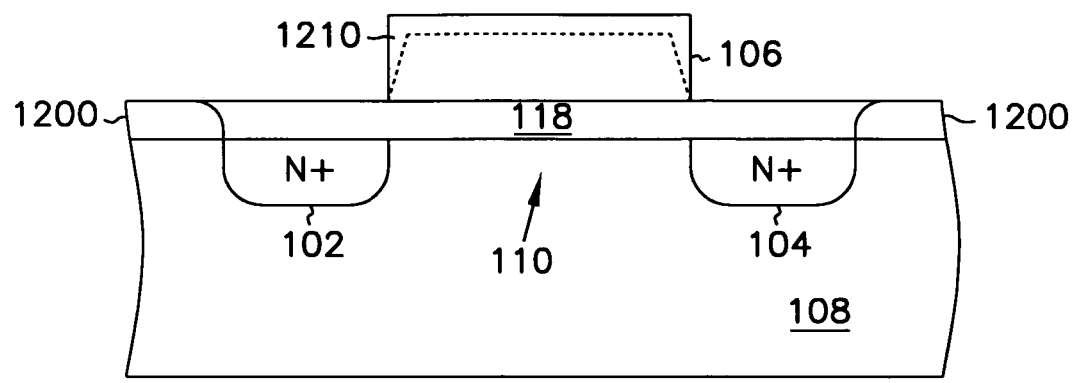

FIG. 12F illustrates generally a self-aligned embodiment of the formation of n-channel FET n+ source region 102 and drain region 104. For a p-channel FET, p+ source drain regions can be similarly formed. The doping of SiC gate 106 can be changed by ion implantation, such as during the formation of n-channel FET or p-channel FET source/drain regions, or subsequently thereto. For example, a p-type SiC film 1206 can be deposited, and its doping then changed to n+ by leaving SiC gate 106 unmasked during the formation of the n+ source region 102 and drain region 104 for the n-channel FET.

Figure 12G:
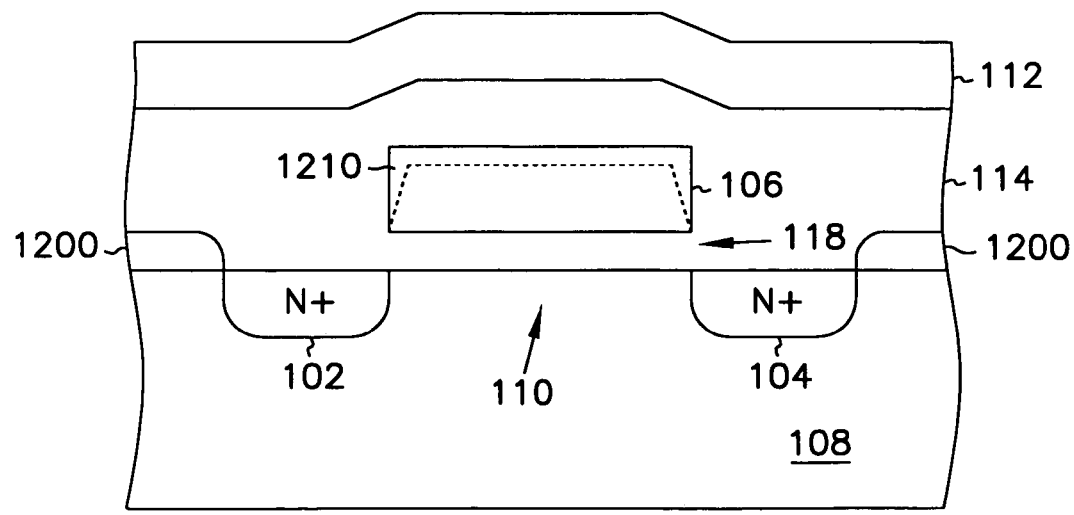

FIG. 12G illustrates generally the formation of an insulating layer, such as oxide 114 or other suitable insulator, after formation of n-channel FET source region 102 and drain region 104. In one embodiment, oxide 114 is deposited over the upper surface of the integrated circuit structure using a standard CVD process. Oxide 114 isolates SiC gate 106 from other gates such as, for example, an overlying or adjacent control gate layer 112 where SiC gate 106 is a floating gate in a floating gate transistor. Oxide 114 also isolates SiC gate 106 from any other conductive layer 112, such as polysilicon layers, gates, metal lines, etc., that are fabricated above and over SiC gate 106 during subsequent process steps.

CONCLUSION

Thus, the invention includes a CMOS-compatible FET having a low electron affinity SiC gate that is either electrically isolated (floating) or interconnected. The SiC composition x is selected to provide the desired barrier at the SiC—SiO$_2$ interface, such as 0.5<x<1.0. In a flash EEPROM application, the SiC composition x is selected to provide the desired programming and erase voltage and time or data charge retention time. In an imaging application, the SiC composition x is selected to provide sensitivity to the desired wavelength of light. Unlike conventional photodetectors, light is absorbed in the floating gate, thereby ejecting previously stored electrons therefrom. Also unlike conventional photodetectors, the light detector according to the present invention is actually more sensitive to lower energy photons as the semiconductor bandgap is increased.

Although specific embodiments have been illustrated and described herein, those of ordinary skill in the art will appreciate that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A device comprising:
   a source region;
   a drain region;
   a channel region between the source and drain regions;
   a floating gate separated from the channel region by an insulator, the floating gate formed of a silicon carbide compound $Si_{1-x}C_x$, wherein x is substantially greater than 0.5 and less than 1.0 and the insulator includes a dielectric other than silicon oxide; and
   a control gate deposed adjacent to the floating gate and separated from the floating gate by an intergate dielectric.

2. The device of claim 1, wherein the device includes a memory device.

3. The device of claim 1, wherein the device further includes electrical interconnections to couple to other devices in a system.

4. A device comprising:
   a source region;
   a drain region;
   a channel region between the source and drain regions;
   a floating gate separated from the channel region by an insulator, the floating gate formed of a silicon carbide compound $Si_{1-x}C_x$ wherein x is substantially greater than 0.5 and less than 1.0; and
   a control gate deposed adjacent to the floating gate and separated from the floating gate by an intergate dielectric.

5. The device of claim 4, wherein x is greater than or equal to 0.6 and less than 1.0.

6. The device of claim 4, wherein x is greater than 0.75 and less than 1.0.

7. A device comprising:
   a source region;
   a drain region;
   a channel region between the source and drain regions;
   a floating gate separated from the channel region by an insulator, the floating gate formed of a silicon carbide compound $Si_{1-x}C_x$, wherein x is between 0 and 1.0; and
   a control gate deposed adjacent to the floating gate and separated from the floating gate by an intergate dielectric, wherein the device is configured as a light detecting device.

8. A device for detecting light, the device comprising:
   a source region;
   a drain region;
   a channel region between the source and drain regions;
   a floating gate separated from the channel region by an insulator, the floating gate formed of a silicon carbide compound $Si_{1-x}C_x$, wherein x is selected at a predetermined value between 0 and 1.0 to establish a desired value of a baffler energy between the floating gate and the insulator for charge storage upon the floating gate and emission of charge from the floating gate in response to absorbed incident photons; and
   a control gate deposed on the floating gate and separated from the floating gate by an intergate dielectric.

9. The device of claim 8, wherein the control gate includes polysilicon material.

10. The device of claim 8, wherein x is selected at a predetermined value that is between 0.5 and 1.0.

11. The device of claim 8, wherein x is selected at a predetermined value to provide a desired value of the baffler energy that is between 0 eV and 2.8 eV.

12. The device of claim 8, wherein the predetermined value x is selected to provide a desired range of photon wavelengths most likely to be absorbed by the floating gate whereby electrons are emitted from the floating gate in response to the absorbed photons.

13. The device of claim 8, wherein the emission of charge from the floating gate in response to incident photons changes a current conductance between the source and drain regions.

14. A memory device comprising:
a plurality of memory cells, wherein each memory cell includes a transistor comprising:
a source region;
a drain region;
a channel region between the source and drain regions;
a floating gate separated from the channel region by an insulator including a dielectric other than silicon oxide, the floating gate formed of a silicon carbide compound $Si_{1-x}C_x$, wherein x is selected at a predetermined value between 0.5 and 1.0 to establish a desired value of a baffler energy between the gate and the insulator; and
a control gate located adjacent to the floating gate and separated therefrom by an interlayer dielectric.

15. The memory device of claim 14, wherein the value of the barrier energy is between 0 eV and 2.8 eV.

16. The memory device of claim 14, wherein the value of x is selected to provide a desired charge retention time of the floating gate.

17. A memory device comprising:
a plurality of memory cells, wherein each memory cell includes a transistor comprising:
a source region:
a drain region:
a channel region between the source and drain regions:
a floating gate separated from the channel region by an insulator, the floating gate formed of a silicon carbide compound $Si_{1-x}C_x$, wherein x is selected at a predetermined value between 0.5 and 1.0 to establish a desired value of a barrier energy between the gate and the insulator; and
a control gate located adjacent to the floating gate and separated therefrom by an interlayer dielectric.

18. A system comprising:
a processor; and
a memory device coupled to the processor through a plurality of lines, the memory device comprising:
a control circuit to control operation of the memory device; and
an array of floating gate transistor memory cells, each memory cell comprising:
a source region formed in a silicon substrate;
a drain region formed in the silicon substrate;
a channel region in the silicon substrate between the source region and the drain region;
a floating gate separated from the channel region by an insulator, the floating gate comprising a silicon carbide compound $Si_{1-x}C_x$, wherein x is selected to be between 0 and 1.0; and
a control gate separated from the floating gate by an intergate dielectric.

19. The system of claim 18, wherein:
the silicon substrate comprises a p-type silicon substrate;
the source region comprises an n+-type source region formed in the silicon substrate;
the drain region comprises an n+-type drain region formed in the silicon substrate;
the insulator comprises silicon dioxide;
the intergate dielectric comprises silicon dioxide;
the lines comprise control lines, data lines, and address lines; and
the memory device further comprises a row decoder, a column decoder, and a voltage control circuit.

20. The system of claim 18, wherein the floating gate comprises a material selected from the group consisting of a monocrystalline silicon carbide compound, a polycrystalline silicon carbide compound, a microcrystalline silicon carbide compound, and a nanocrystalline silicon carbide compound.

21. A system comprising:
a processor; and
a memory device coupled to the processor through a plurality of lines, the memory device comprising:
a control circuit to control operation of the memory device; and
an array of floating gate transistor memory cells, each memory cell comprising:
a source region formed in a substrate;
a drain region formed in the substrate;
a channel region in the substrate between the source region and the drain region;
a floating gate separated from the channel region by an insulator, the floating gate comprising a silicon carbide compound $Si_{1-x}C_x$, wherein x is selected to be between 0.5 and 1.0; and
a control gate separated from the floating gate by an intergate dielectric.

22. The system of claim 21, wherein:
the substrate comprises a p-type silicon substrate;
the source region comprises an n+-type source region formed in the substrate;
the drain region comprises an n+-type drain region formed in the substrate;
the insulator comprises silicon dioxide;
the intergate dielectric comprises silicon dioxide;
the lines comprise control lines, data lines, and address lines; and
the memory device further comprises a row decoder, a column decoder, and a voltage control circuit.

23. The system of claim 21, wherein the floating gate comprises a material selected from the group consisting of a monocrystalline silicon carbide compound, a polycrystalline silicon carbide compound, a microcrystalline silicon carbide compound, and a nanocrystalline silicon carbide compound.

24. A system comprising:
a processor; and
a memory device coupled to the processor through a plurality of lines, the memory device comprising:
a control circuit to control operation of the memory device; and
an array of floating gate transistor memory cells, each memory cell comprising:
a source region formed in a substrate;
a drain region formed in the substrate;
a channel region in the substrate between the source region and the drain region;
a floating gate separated from the channel region by an insulator, the floating gate comprising a silicon carbide compound $Si_{1-x}C_x$, wherein x is selected to be between 0.5 and 0.75; and
a control gate separated from the floating gate by an intergate dielectric.

25. The system of claim 24, wherein:
the substrate comprises a p-type silicon substrate;
the source region comprises an n+-type source region formed in the substrate;
the drain region comprises an n+-type drain region formed in the substrate;
the insulator comprises silicon dioxide;
the intergate dielectric comprises silicon dioxide;
the lines comprise control lines, data lines, and address lines; and the memory device further comprises a row decoder, a column decoder, and a voltage control circuit.

26. The system of claim 24, wherein the floating gate comprises a material selected from the group consisting of a monocrystalline silicon carbide compound, a polycrystalline silicon carbide compound, a microcrystalline silicon carbide compound, and a nanocrystalline silicon carbide compound.

27. A system comprising:

a processor; and a memory device coupled to the processor through a plurality of lines, the memory device comprising:

a control circuit to control operation of the memory device; and an array of floating gate transistor memory cells, each memory cell comprising:

a source region formed in a substrate;

a drain region formed in the substrate;

a channel region in the substrate between the source region and the drain region;

a floating gate separated from the channel region by an insulator, the floating gate comprising a silicon carbide compound $Si_{1-x}C_x$, wherein x is selected to be between 0.75 and 1.0; and a control gate separated from the floating gate by an intergate dielectric.

28. The system of claim 27, wherein:

the substrate comprises a p-type silicon substrate;

the source region comprises an n+-type source region formed in the substrate;

the drain region comprises an n+-type drain region formed in the substrate;

the insulator comprises silicon dioxide;

the intergate dielectric comprises silicon dioxide;

the lines comprise control lines, data lines, and address lines; and the memory device further comprises a row decoder, a column decoder, and a voltage control circuit.

29. The system of claim 27, wherein the floating gate comprises a material selected from the group consisting of a monocrystalline silicon carbide compound, a polycrystalline silicon carbide compound, a microcrystalline silicon carbide compound, and a nanocrystalline silicon carbide compound.

* * * * *

UNITED STATES PATENT AND TRADEMARK OFFICE
CERTIFICATE OF CORRECTION

PATENT NO. : 7,141,824 B2
APPLICATION NO. : 11/073773
DATED : November 28, 2006
INVENTOR(S) : Forbes et al.

It is certified that error appears in the above-identified patent and that said Letters Patent is hereby corrected as shown below:

On the Title page, item (54), delete "TRANSISTOR" and insert -- SYSTEMS AND DEVICES --, therefor.

On the Title page, item (57), under "Abstract", in column 2, line 2, delete "SIC" and insert -- SiC --, therefor.

In column 1, line 1, delete "TRANSISTOR" and insert -- SYSTEMS AND DEVICES --, therefor.

In column 4, line 4, delete "baffler" and insert -- barrier--, therefor.

In column 4, line 19, delete "baffler" and insert -- barrier --, therefor.

In column 4, line 54, delete "baffler" and insert -- barrier --, therefor.

In column 4, line 59, delete "baffler" and insert -- barrier --, therefor.

In column 5, line 11, delete "baffler" and insert -- barrier --, therefor.

In column 16, line 17, in Claim 4, delete "$Si_{1-x}C_x$wherein" and insert -- $Si_{1-x}C_x$, wherein --, therefor.

In column 16, line 46, in Claim 8, delete "baffler" and insert -- barrier --, therefor.

In column 16, line 57, in Claim 11, delete "baffler" and insert -- barrier --, therefor.

In column 17, line 12, in Claim 14, delete "baffler" and insert -- barrier --, therefor.

In column 17, line 24, in Claim 17, after "region" delete ":" and insert -- ; --, therefor.

In column 17, line 25, in Claim 17, after "region" delete ":" and insert -- ; --, therefor.

UNITED STATES PATENT AND TRADEMARK OFFICE
CERTIFICATE OF CORRECTION

PATENT NO. : 7,141,824 B2
APPLICATION NO. : 11/073773
DATED : November 28, 2006
INVENTOR(S) : Forbes et al.

It is certified that error appears in the above-identified patent and that said Letters Patent is hereby corrected as shown below:

In column 17, line 26, in Claim 17, after "region" delete ":" and insert -- ; --, therefor, Signed and Sealed this Third Day of April, 2007

JON W. DUDAS
*Director of the United States Patent and Trademark Office*